US010488284B2

(12) United States Patent
Jentoft et al.

(10) Patent No.: US 10,488,284 B2
(45) Date of Patent: Nov. 26, 2019

(54) METHOD OF MAKING A CONTACT PRESSURE SENSOR

(71) Applicant: PRESIDENT AND FELLOWS OF HARVARD COLLEGE, Cambridge, MA (US)

(72) Inventors: Leif Jentoft, Cambridge, MA (US); Yaroslav Tenzer, Somerville, MA (US); Robert Howe, Cambridge, MA (US)

(73) Assignee: PRESIDENT AND FELLOWS OF HARVARD COLLEGE, Cambridge, MA (US)

( * ) Notice: Subject to any disclaimer, the term of this patent is extended or adjusted under 35 U.S.C. 154(b) by 91 days.

(21) Appl. No.: 15/461,781

(22) Filed: Mar. 17, 2017

(65) Prior Publication Data
US 2017/0191891 A1  Jul. 6, 2017

Related U.S. Application Data

(62) Division of application No. 14/212,609, filed on Mar. 14, 2014, now Pat. No. 9,625,333.
(Continued)

(51) Int. Cl.
*H05K 1/02* (2006.01)
*G01L 5/22* (2006.01)
(Continued)

(52) U.S. Cl.
CPC ............. *G01L 5/228* (2013.01); *G01L 1/02* (2013.01); *G01L 5/16* (2013.01); *H01L 2224/48137* (2013.01); *Y10T 29/49007* (2015.01)

(58) Field of Classification Search
CPC .... A61B 5/02; G01L 1/02; G01L 5/16; G01L 5/228; H01L 2224/48137
See application file for complete search history.

(56) References Cited

U.S. PATENT DOCUMENTS 3,308,253 A  3/1967 Krakinowski
4,306,148 A  12/1981 Ringwall et al.
(Continued)

OTHER PUBLICATIONS

Beebe et al., "A silicon force sensor for robotics and medicine", Sensors and Actuators A 50:55-65 (1995).
(Continued)

*Primary Examiner* — Carl J Arbes
(74) *Attorney, Agent, or Firm* — Nixon Peabody LLP; Ronald I. Eisenstein; David S. Resnick

(57) ABSTRACT

A tactile sensor includes a pressure transducer encapsulated in an elastic material that defines a contact surface and provides a transmission path that transmits contact forces or pressure distributions applied to the contact surface to the pressure transducer. The pressure transducer can be enclosed in a protective housing that defines a chamber around the transducer. The housing can include one or more openings that expose the chamber to the exterior pressure. The tactile sensor can be made by applying the elastic material in liquid form and exposing the housing to a vacuum that removes air inside the chamber allowing the liquid elastic material to flow into the chamber. Once cured, the elastic material defines a contact surface of the tactile sensor and serves to transfer contact forces applied to the contact surface to the transducer.

19 Claims, 26 Drawing Sheets

Related U.S. Application Data

(60) Provisional application No. 61/788,711, filed on Mar. 15, 2013.

(51) Int. Cl.
  *G01L 5/16* (2006.01)
  *G01L 1/02* (2006.01)

(56) References Cited

U.S. PATENT DOCUMENTS

| | | | |
|---|---|---|---|
| 4,481,815 A | 11/1984 | Overton | |
| 4,492,949 A | 1/1985 | Peterson et al. | |
| 4,521,685 A | 6/1985 | Rebman | |
| 4,526,043 A | 7/1985 | Boie et al. | |
| 4,555,953 A | 12/1985 | Dario et al. | |
| 4,555,954 A | 12/1985 | Kim | |
| 4,573,362 A | 3/1986 | Amlani | |
| 4,574,438 A | 3/1986 | Diepers et al. | |
| 4,576,181 A * | 3/1986 | Wallace | A61B 5/0215 600/488 |
| 4,581,491 A | 4/1986 | Boothroyd | |
| 4,584,625 A | 4/1986 | Kellogg | |
| 4,610,256 A * | 9/1986 | Wallace | A61B 5/0215 600/486 |
| 4,616,511 A | 10/1986 | Gindy et al. | |
| 4,621,533 A | 11/1986 | Gindy | |
| 4,634,917 A | 1/1987 | Dvorsky et al. | |
| 4,640,137 A | 2/1987 | Trull et al. | |
| 4,679,567 A * | 7/1987 | Hanlon | A61B 5/0215 600/488 |
| 4,694,231 A | 9/1987 | Alvite | |
| 4,709,342 A | 11/1987 | Hosoda et al. | |
| 4,747,313 A | 5/1988 | Okada | |
| 4,814,562 A | 3/1989 | Langston | |
| 4,817,440 A | 4/1989 | Curtin | |
| 4,825,876 A * | 5/1989 | Beard | A61B 5/0215 439/930 |
| 4,866,412 A | 9/1989 | Rzepczynski | |
| 4,886,361 A | 12/1989 | Furstenau | |
| 4,964,302 A | 10/1990 | Grahn et al. | |
| 4,980,646 A | 12/1990 | Zemel | |
| 5,010,774 A | 4/1991 | Kikuo et al. | |
| 5,014,224 A | 5/1991 | Hans | |
| 5,033,291 A | 7/1991 | Podoloff et al. | |
| 5,055,838 A | 10/1991 | Wise et al. | |
| 5,060,527 A | 10/1991 | Burgess | |
| 5,138,216 A | 8/1992 | Woodruff et al. | |
| 5,200,679 A | 4/1993 | Graham | |
| 5,209,126 A | 5/1993 | Grahn | |
| 5,225,959 A | 7/1993 | Stearns | |
| 5,261,266 A | 11/1993 | Lorenz et al. | |
| 5,311,779 A | 5/1994 | Teruo | |
| 5,581,038 A * | 12/1996 | Lampropoulos | A61B 5/0215 73/721 |
| 5,760,530 A | 6/1998 | Kolesar | |
| 5,905,430 A | 5/1999 | Yoshino et al. | |
| 5,983,725 A | 11/1999 | Fischer et al. | |
| 5,993,395 A * | 11/1999 | Shulze | A61B 5/0215 600/486 |
| 6,003,390 A | 12/1999 | Cousy | |
| 6,007,728 A | 12/1999 | Liu et al. | |
| 6,067,862 A | 5/2000 | Murray et al. | |
| 6,117,086 A * | 9/2000 | Shulze | A61B 5/0215 600/486 |
| 6,154,580 A | 11/2000 | Kuriyama et al. | |
| 6,188,331 B1 | 2/2001 | Zee et al. | |
| 6,443,509 B1 | 9/2002 | Levin et al. | |
| 6,445,284 B1 | 9/2002 | Cruz-Hernandez et al. | |
| 6,529,122 B1 | 3/2003 | Magnussen et al. | |
| 6,543,307 B2 | 4/2003 | Ambrose | |
| 6,593,756 B1 | 7/2003 | Schmidt et al. | |
| 6,769,313 B2 | 8/2004 | Weiss | |
| 6,848,320 B2 | 2/2005 | Miyajima et al. | |
| 6,871,395 B2 | 3/2005 | Scher et al. | |
| 6,886,415 B1 | 5/2005 | Kurogi et al. | |
| 6,888,537 B2 | 5/2005 | Benson et al. | |
| 6,915,701 B1 | 7/2005 | Tarler | |
| 6,955,094 B1 | 10/2005 | Tarler | |
| 6,996,456 B2 | 2/2006 | Cordell et al. | |
| 7,004,039 B1 | 2/2006 | Ford et al. | |
| 7,549,688 B2 | 6/2009 | Hayakawa et al. | |
| 7,658,119 B2 | 2/2010 | Loeb et al. | |
| 7,878,075 B2 | 2/2011 | Johansson et al. | |
| 8,033,189 B2 | 10/2011 | Hayakawa et al. | |
| 8,266,971 B1 | 9/2012 | Jones | |
| 8,272,278 B2 | 9/2012 | Loeb et al. | |
| 8,640,550 B2 | 2/2014 | Nishiwaki | |
| 2002/0050170 A1 | 5/2002 | Petrovic et al. | |
| 2003/0030457 A1 | 2/2003 | Akram | |
| 2003/0217602 A1 | 11/2003 | Steger | |
| 2004/0093954 A1 | 5/2004 | Gottlieb et al. | |
| 2006/0059997 A1 | 3/2006 | Kim et al. | |
| 2006/0207333 A1 | 9/2006 | Martin | |
| 2009/0320611 A1 | 12/2009 | Vasarhelyi et al. | |
| 2010/0320066 A1 | 12/2010 | Rosenau et al. | |
| 2011/0167993 A1 | 7/2011 | Lan et al. | |
| 2011/0209337 A1 | 9/2011 | Pei et al. | |
| 2011/0303016 A1 | 12/2011 | Gutierrez et al. | |
| 2011/0308322 A1 | 12/2011 | Liao | |
| 2012/0204652 A1 | 8/2012 | Ho et al. | |
| 2012/0240691 A1 | 9/2012 | Wettels et al. | |
| 2014/0069212 A1 | 3/2014 | Fishel et al. | |

OTHER PUBLICATIONS

Beyeler et al., "A Six-Axis MEMS Force-Torque Sensor With Micro-Newton and Nano-Newtonmeter Resolution", Journal of Microelectomechanical Systems 18(2):433-441 (2009).

Butterfass et al., "DLR's Multisensory Articulated Hand Part I: Hard- and Software Architecture", Proceedings of the 1998 IEEE, International Conference on Robotics & Automation Leuven, Belgium, May 1998, pp. 2081-2086.

Cannata et al., "An Embedded Artificial Skin for Humanoid Robots", Proceedings of IEEE International Conference on Multisensor Fusion and Integration for Intelligent Systems, Seoul, Korea, Aug. 20-22, 2008, pp. 434-438.

Cannata et al., "Design of a Tactile Sensor for Robot Hands", in Sensors, Focus on Tactile, Force and Stress Sensors,Rocha et al. (Ed.), 271-288 (2008).

Cutkosky et al., "Force and Tactile Sensors", in Springer Handbook of Robotics, Siciliano et al. (Ed.), 455-471 (2008).

Dahiya et al., "Tactile Sensing—From Humans to Humanoids", IEEE Transactions on Robotics 26(1):1-20 (2010).

Dollar et al., "A Robust Complaint Grasper via Shape Deposition Manufacturing", IEEE/ASME Transactions on Mechatronics 11(2):154-161 (2006).

Fearing et al., "Basic Solid Mechanics for Tactile Sensing", The International Journal of Robotics Research 4(3):266-275 (1984).

Freescale Semiconductor, "MPL115A2, Miniature I2C Digital Barometer", Datasheet, pp. 1-8 (2010).

Kilaru et al., "NiCr MEMS Tactile Sensors Embedded in Polyimide Toward Smart Skin", Journal of Microelectromechanical Systems 22(2):349-355 (2013).

Lammel et al., "Pressure sensors provide indoor competency for navigation", Small Times 1-4, (2009).

Lee et al., "Tactile sensing for mechatronics-a state of the art survey", Mechatronics 9(1):1-31 (1999).

Maggiali et al., "Embedded Distributed Capacitive Tactile Sensor", 11th Mechatronics Forum Biennial International Conference, pp. 1-5 (2008).

Maria et al., "Tactile Sensor for Human-like Manipulation", The Fourth IEEE RAS/EMBS International Conference on Biomedical Robotics and Biomechatronics, Roma, Italy. Jun. 24-27, 2012 pp. 1686-1691.

Mei et al., "An integrated MEMS three-dimensional tactile sensor with large force range", Sensors and Actuators 80:155-162 (2000).

Muhammad et al., "Development of a bioinspired MEMS based capacitive tactile sensor for a robotic finger", Sensors and Actuators A 165:221-229 (2011).

(56) References Cited

OTHER PUBLICATIONS

Nicholls et al., "A Survey of Robot Tactile Sensing Technology", The International Journal of Robotics Research 8 (3):3-30 (1989).
Obana et al., "A Semiconductor Strain Gage Tactile Transducer", IEEE Instrumentation and Measurement Technology Conference, Budapest, Hungary, May 21-23, 2001, pp. 429-432.
http://www.pressureprofile.com/ "Pressure Profile Systems".
Saccomandi et al., "Microfabricated Tactile Sensors for Biomedical Applications: A Review", Biosensors 4:422-448 (2014).
Semiconductors, "UM10204, I2C-bus specification and user manual", User Manual (2012).
Sensortec, "BMP085, Digital pressure sensor", Data sheet (2009).
http://www.syntouchllc.com/ "Syntouch—The BioTac Multimodal Tactile Sensor".
http://www.takktile.com "Takktile Project. Open source tactile array".
Tarchanidis et al., "Data Glove with a Force Sensor", IEEE Instrumentation and Measurement Technology Conference, Budapest, Hungary, May 21-23, 2001, pp. 380-385.
Tegin et al., "Tactile sensing in intelligent robotic manipulation—a review", Industrial Robot: An International Journal, 32(1):64-70 (2005).
http://www.tekscan.com/ "Pressure Mapping, Force Measurement & Tactile Sensors".
Tenzer et al., "Inexpensive and Easily Customized Tactile Array Sensors using MEMS Barometers Chips", IEEE Robotics and Automation Magazine (2012).
Ulmen et al., "A Robust, Low-Cost and Low-Noise Artificial Skin for Human-Friendly Robots", 2010 IEEE International Conference on Robotics and Automation, Anchorage Convention District, May 3-8, 2010, Anchorage, Alaska, USA pp. 4836-4841.
Wheeler et al., "MEMS-Based Bubble Pressure Sensor for Prosthetic Socket Interface Pressure Measurement", 33rd Annual International Conference of the IEEE EMBS, Boston, Massachusetts, USA, Aug. 30-Sep. 3, 2011, pp. 2925-2928.
Yang et al., "A 32×32 temperature and tactile sensing array using PI-copper films", Int. J. Adv. Manuf. Technol. 46:945-956 (2010).
Yousef et al., "Tactile sensing for dexterous in-hand manipulation in robotics—A review", Sensors and Actuators A 167:171-187 (2011).
Zillich et al., "A versatile tactile sensor system for covering large and curved surface areas", 2012 IEEE/RSJ International Conference on Intelligent Robots and Systems, Oct. 7-12, 2012. Vilamoura, Algarve, Portugal, pp. 20-24.
Liu et al.,"A Tactile Sensing System for the DLR Three-Finger Robot Hand" Proceedings of the Fourth International Symposium on Measurement and Control in Robotics, pp. 91-96 (1995).

* cited by examiner

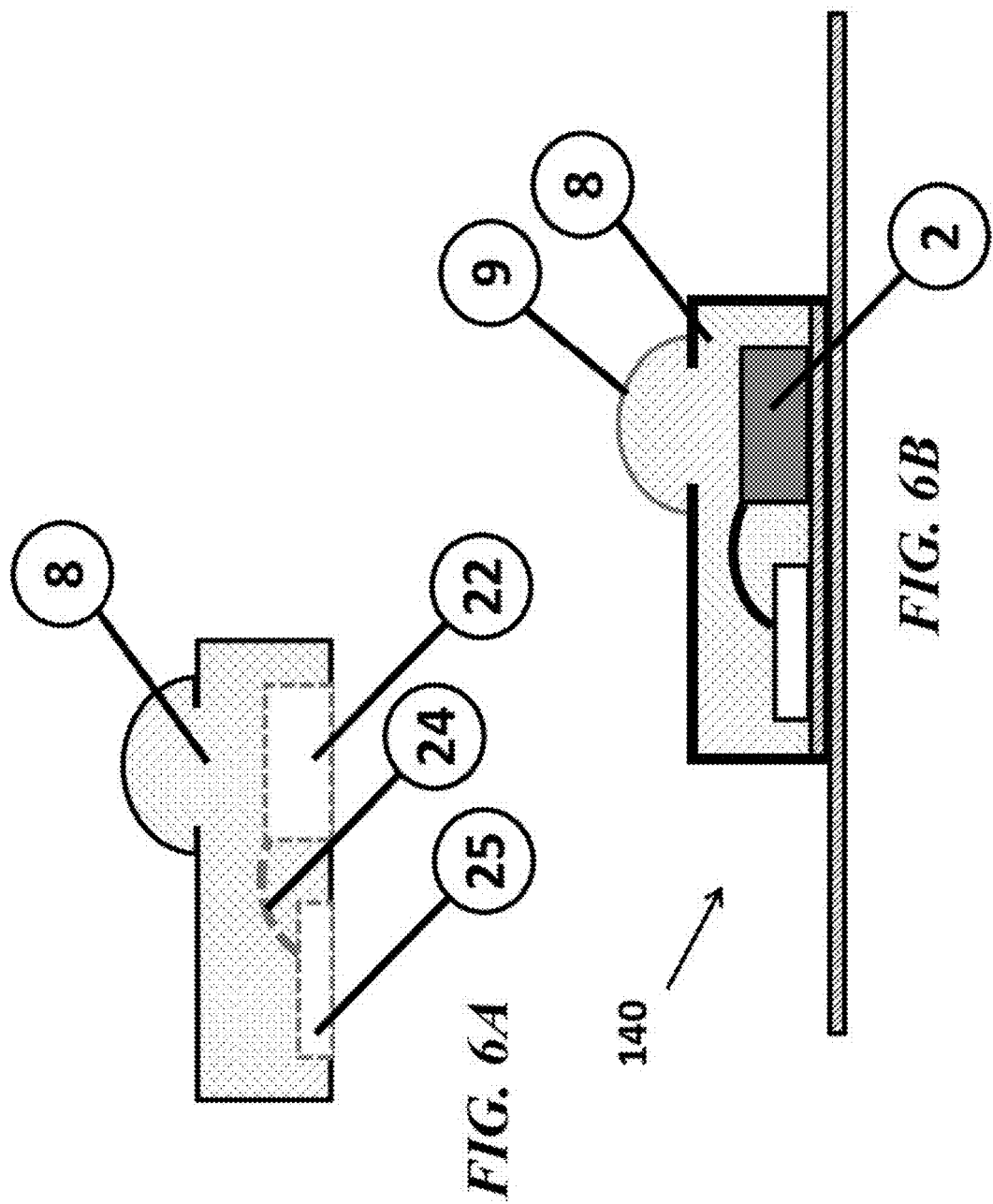

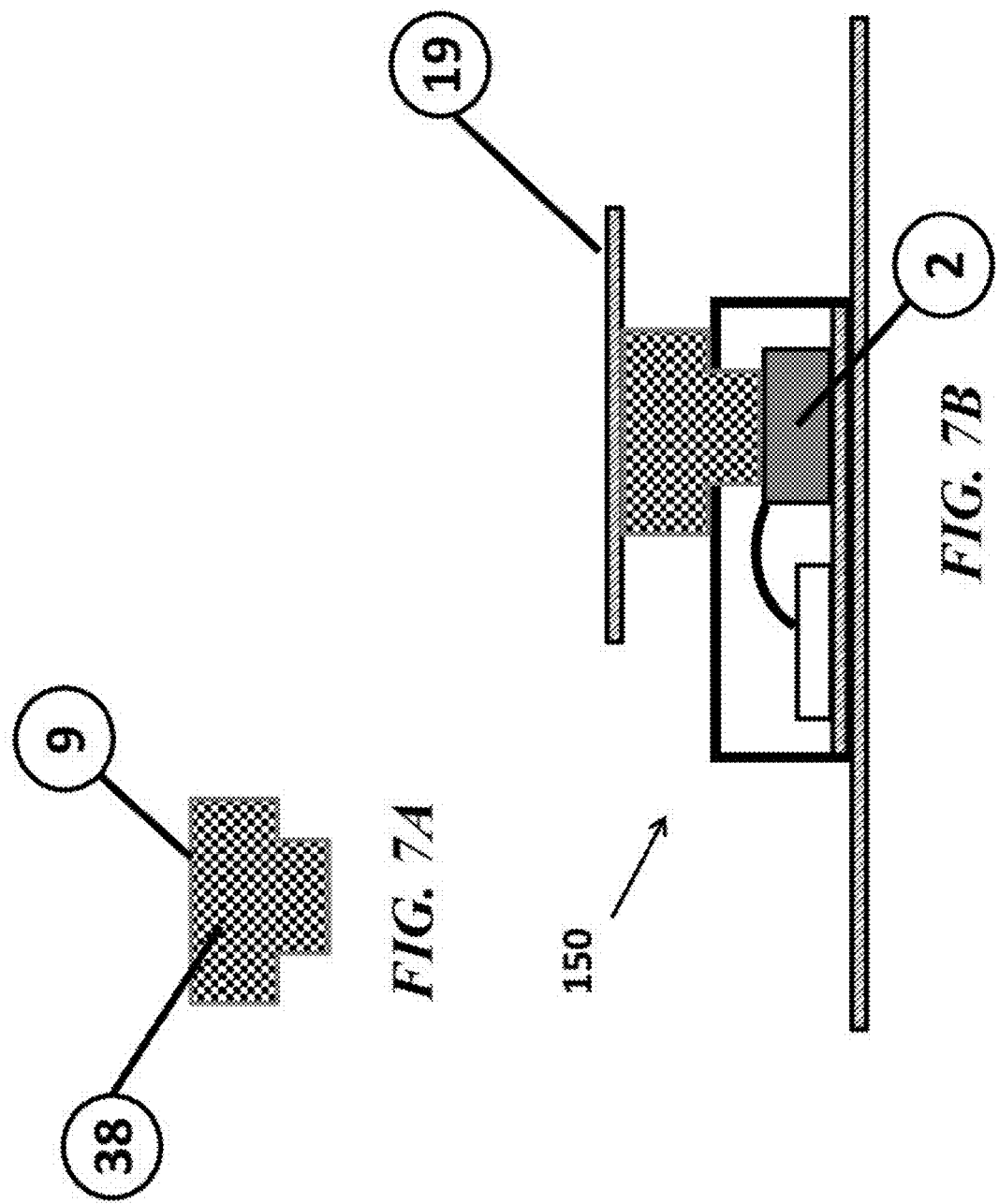

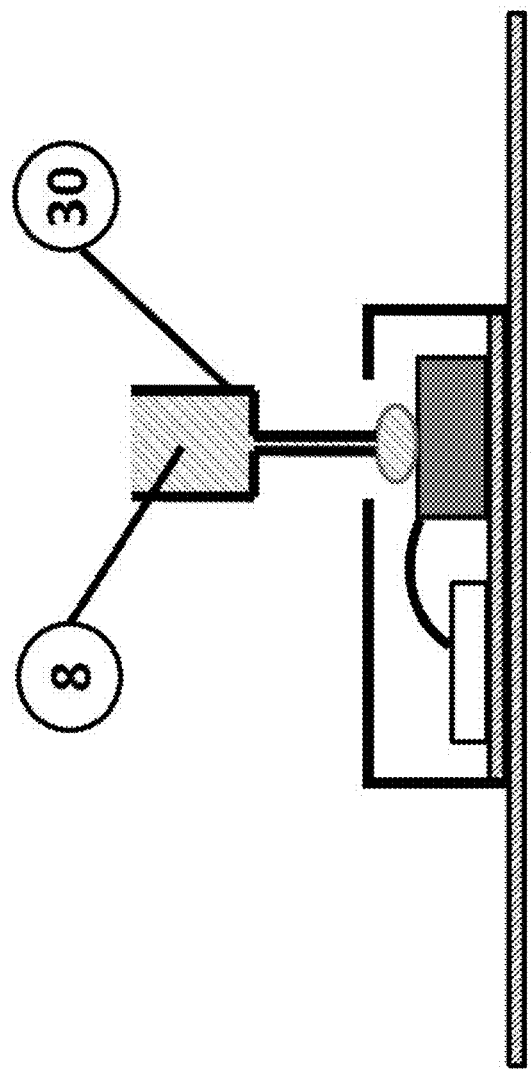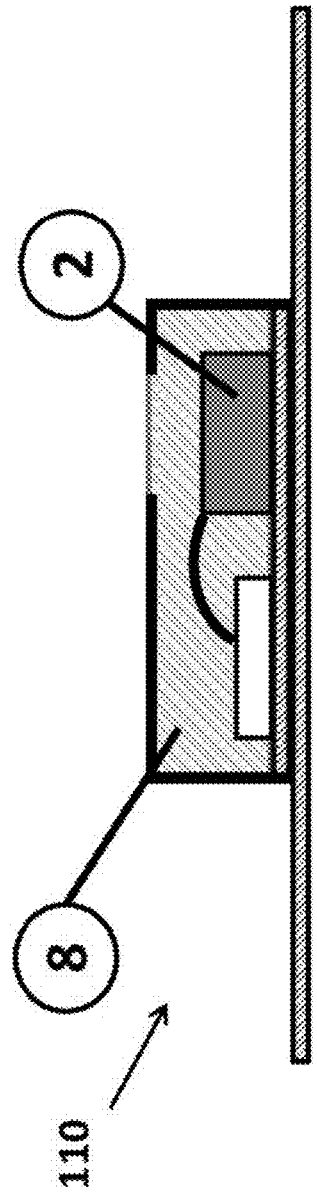
FIG. 8A
FIG. 8B

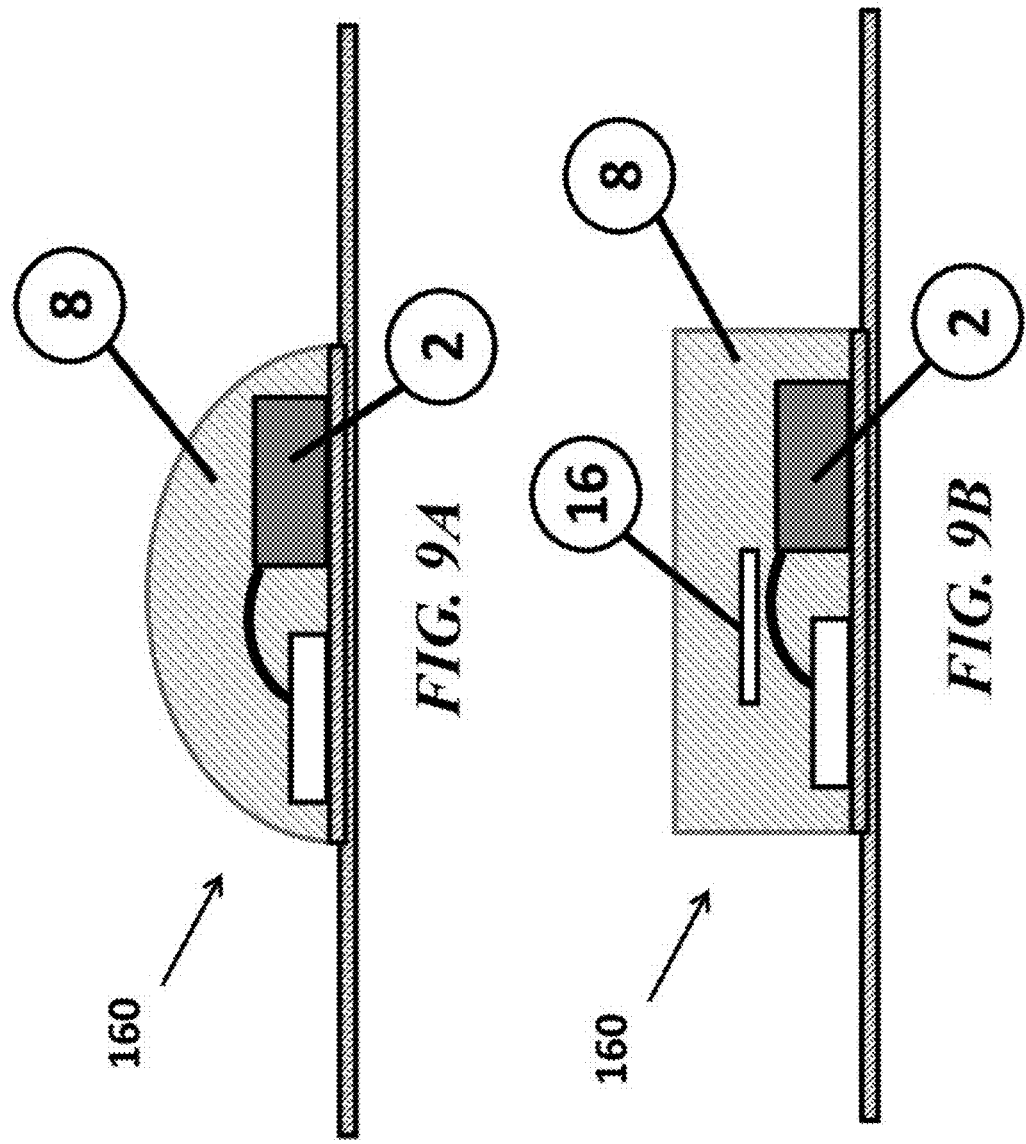

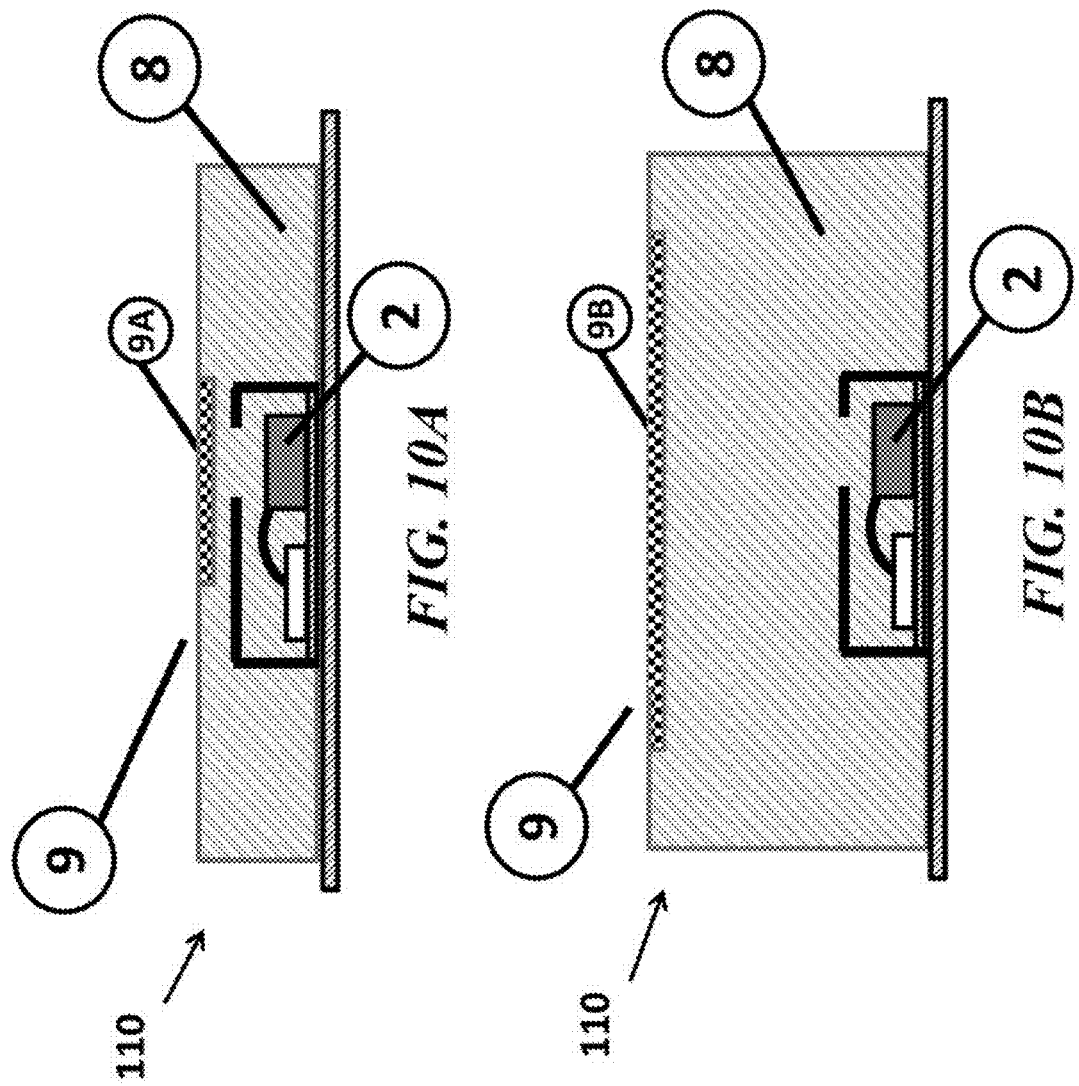

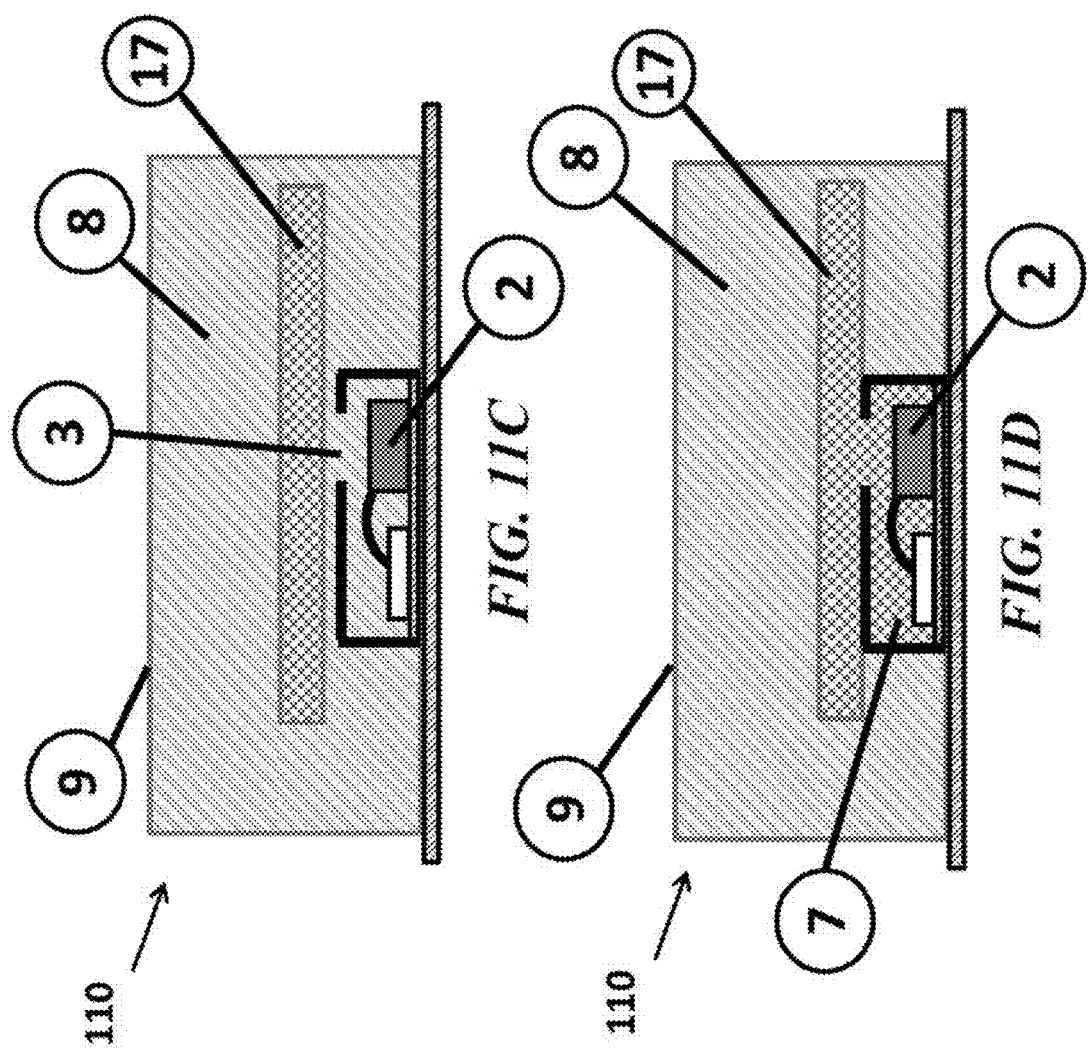

METHOD OF MAKING A CONTACT PRESSURE SENSOR

CROSS-REFERENCE TO RELATED APPLICATIONS

This application is a divisional application of U.S. application Ser. No. 14/212,609, filed on Mar. 14, 2014, and which claims benefit under 35 U.S.C. § 119(e) of the U.S. Provisional Application No. 61/788,711, filed on Mar. 15, 2013, the contents of are incorporated herein by reference in their entirety.

STATEMENT REGARDING FEDERALLY SPONSORED RESEARCH

This invention was made with government support under grant no. IIS-0905180 awarded by the National Science Foundation. The government has certain rights in the invention.

REFERENCE TO MICROFICHE APPENDIX

Not Applicable

BACKGROUND

Technical Field of the Invention

The present invention is directed to a tactile sensor and a method for making the same. Specifically, the invention is directed to a tactile sensor formed by a applying a contact transmission medium to a pressure sensor and method for making the tactile sensor by mounting the pressure sensor to a substrate and then introducing the contact transmission medium between the transducer and a contact surface, as well as methods to modify the response of said sensor.

Description of the Prior Art

Tactile sensing is used in the field of robotics and manufacturing in general to indicate to a control system that a component of a machine has come in contact with an object, either intentionally (e.g., a part is taken from a storage rack) or unintentionally (e.g., a moving component comes in contact with a person or moving automated vehicle). Some tactile sensors merely indicate that contact above a threshold force level is made. Other tactile sensors can provide a measure of the contact force or pressure distribution and can be used to enable machines to interact fragile items without damage.

A tactile sensor generally refers to any sensor that creates an electrically usable signal from pressure or force generated by contact, e.g. with objects or other parts of a mechanism. Some tactile sensors provide very little information, detecting only whether contact above some threshold force or pressure has been made. Others provide detailed spatial measurements, and can be used to determine the location and magnitude of a force applied to a surface, or to estimate the force and torque applied to a rigid body in contact with several tactile sensors (such as the force and torque exerted on the ground by the sole of a foot). In consumer products, industrial automation, and other robotics applications, tactile sensors are often used to detect collisions, which can be intentional, e.g. when a part is picked up from a storage rack, or unintentional, e.g. when a machine accidentally collides with a wall or a human operator.

SUMMARY

The present invention is directed to a tactile sensor formed by applying a contact transmission medium to a pressure sensor or transducer, so that contact forces applied to the transmission medium can be sensed by the sensor or transducer. The pressure sensor can include a housing having at least one opening and the transmission medium can extend through the opening to provide a contact surface to receive contact forces for transmission to the transducer inside the housing.

The present invention is directed to a tactile sensor including a pressure transducer and a controller, mounted to a substrate, and wherein the pressure transducer is connected to the controller by wires. The controller serves to process the transducer signals and transmit the processed signals to an external circuit. The tactile sensor further includes an outer case or housing, attached to the substrate that encloses and protects the transducer sensor, the controller and the wires. In some embodiments, the substrate can be soldered or otherwise connected to circuit board or electrical interconnect component to electrically connect the tactile sensor to a circuit. The housing can include one or more holes that can enable liquids and gases to come in contact with the pressure transducer. The tactile sensor further includes a contact transmission medium that can encapsulate the housing and fill any space between the pressure transducer and the inside of the housing. The contract transmission medium defines an outer contact surface, such that when an object makes contact with the outer contact surface, the contract force is transmitted through the contact transmission medium to the pressure transducer which generates a signal indicating that contact was made. In some embodiments of the invention, the signal generated by the pressure transducer can be used to determine the contact force or pressure distribution applied by the object contacting the outer contact surface.

In accordance with implementations of the invention, one or more of the following capabilities may be provided. The present invention provides a relatively low cost tactile sensor that can be adapted for a wide range of applications. The tactile sensor according to the invention can be produced using a simple and low cost fabrication process.

These and other capabilities of the invention, along with the invention itself, will be more fully understood after a review of the following figures, detailed description, and claims.

BRIEF DESCRIPTION OF THE FIGURES

The accompanying drawings, which are incorporated into this specification, illustrate one or more exemplary embodiments of the inventions and, together with the detailed description, serve to explain the principles and applications of these inventions. The drawings and detailed description are illustrative, not limiting, and can be adapted without departing from the spirit and scope of the inventions.

FIGS. 6A and 6B show an alternative embodiment of the tactile sensor according to the invention.

FIGS. 7A and 7B show an alternative embodiment of the tactile sensor according to the invention.

FIGS. 8A and 8B show an alternative method of making a tactile sensor according to the invention.

FIGS. 9A and 9B show alternative methods of making a tactile sensor according to the present invention.

FIGS. 10A and 10B show different configurations of a tactile sensor according to the invention.

FIGS. 11A-11D show alternative embodiments of a tactile sensor according to the present invention wherein the elastic material includes additional elements that modify the force transmission characteristics of the force transmission medium.

DETAILED DESCRIPTION OF PREFERRED EMBODIMENTS

The present invention is directed to tactile sensors and methods for making the tactile sensor. The tactile sensor includes a sensor element mounted to a substrate and includes contact force transmission medium positioned between the contact surface and the sensor element, such that contact forces or pressure distributions applied to the contact surface can be transmitted to the sensor element. The sensor element generates a signal in response to the sensed force and a microcontroller can process the signal and forward the processed signal to the control system that is monitoring the sensor.

Figure 1:
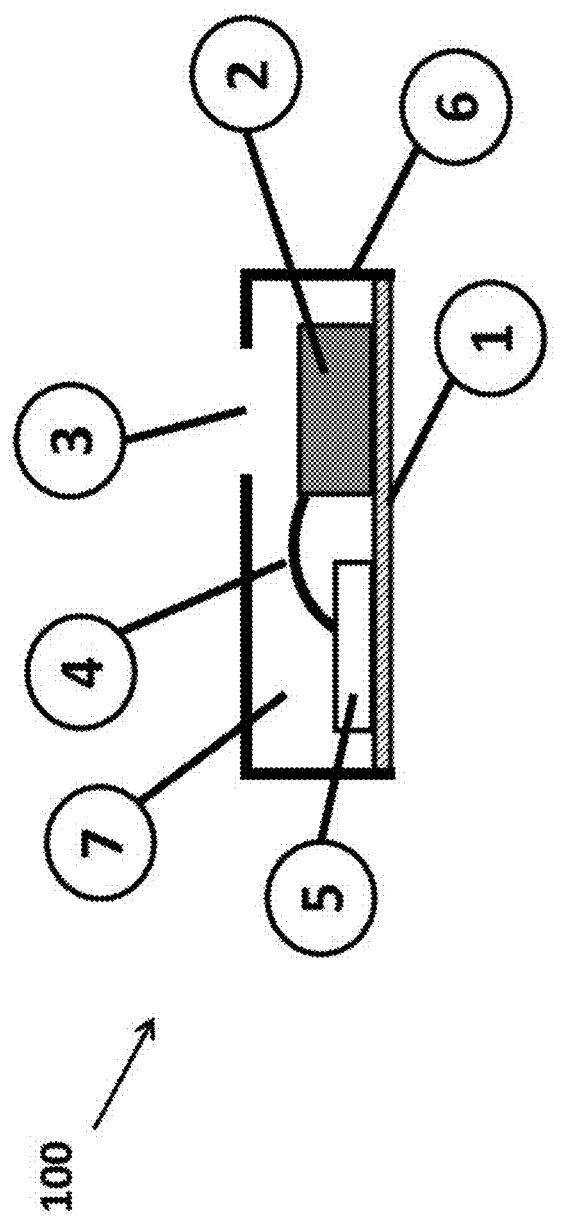
FIG. 1 shows a prior art air pressure sensor.

FIG. 1 shows a prior art air pressure sensor 100. The sensor 100 includes a transducer 2 and microcontroller 5 mounted to a substrate 1. Wires 4 can be used connect the transducer 2 to the microcontroller 5. The transducer 2, microcontroller 5 and the wires 4 can be protected by a housing 6 that can be secured to the substrate 1. The housing 6 creates a chamber 7 around the transducer 2 and a hole 3 in the housing 6 allows fluid pressure, such as air pressure, into the housing 6 which can be sensed by the transducer 2.

Figure 2:
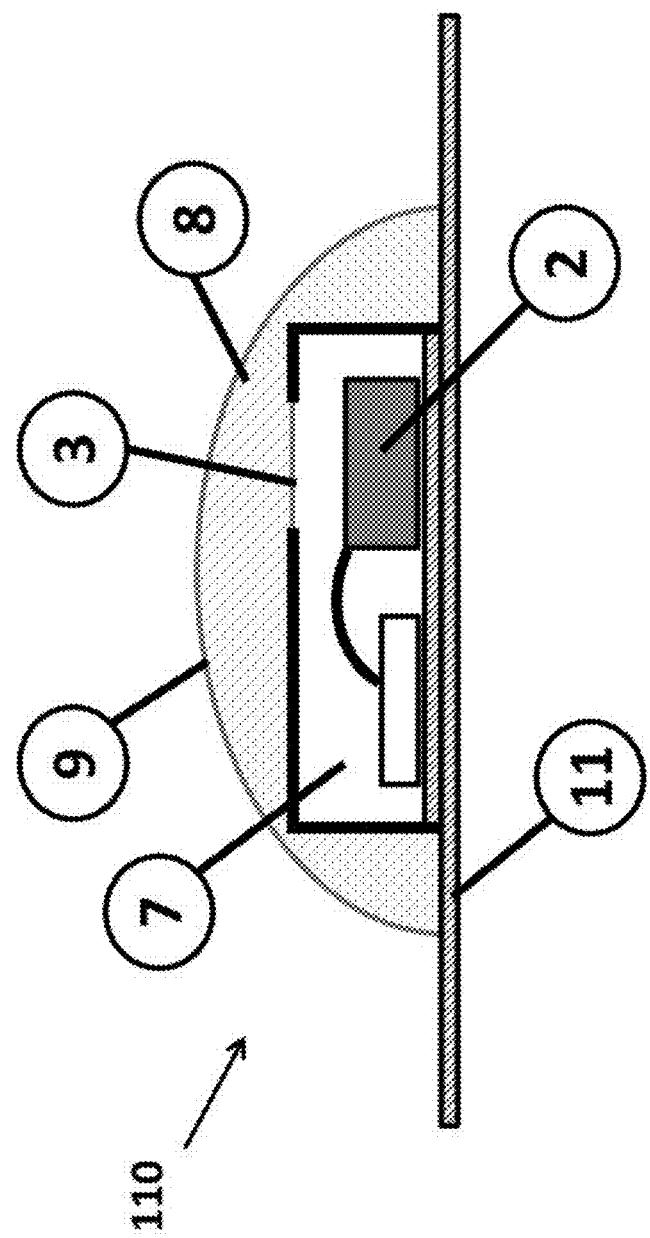
FIG. 2 shows a tactile sensor according to embodiments of the invention.

In accordance with some embodiments, the substrate 1 can include a supporting or mounting material, such as FR4, and provides metallic pads or other electrical interconnect components that enable sensor 100 to be soldered or otherwise interconnected with an electronic circuit. For example, as shown in FIG. 2, the sensor 100 can be soldered to a circuit board 11 to become part of an electronic circuit. In accordance with some embodiments, the transducer 2 can include a diaphragm and piezo-resistive components as part of a micro-electro-mechanical system (MEMS) that provides a signal indicative of changes in pressure applied to the diaphragm. The transducer 2 signal can be transmitted over wires 4 to microcontroller 5 which can process the raw transducer 2 signals and generate a signal indicative of the pressure applied to the transducer 2. In accordance with some embodiments of the invention, sensor 100 can output a continuous signal representative of the sensed pressure. In accordance with other embodiments of the invention, sensor 100 can include a communications interface (e.g., I2C, RS232, etc.) that enables an external circuit to communicate with the device to obtain sensor readings. One example of prior art pressure sensor 100 is the MPL115A2 absolute pressure sensor available from Freescale Semiconductor, Inc., Austin, Tex.

FIG. 2 shows a tactile sensor 110 according to the invention. In this embodiment, the sensor 100 mounted to a circuit board 11 and enclosed in a flexible or elastic material 8. The elastic material 8 defines a contact surface 9 and transfers contact forces through opening 3 into chamber 7. In accordance with some embodiments of the invention, the chamber 7 can be filled with a flexible solid or a fluid, which can include a liquid or a gas, such as air. In accordance with some embodiments of the invention, the fluid is preferably incompressible so that the pressure from the contact force is faithfully transmitted to the transducer 2. In addition, the electrical connection between the transducer 2 and the microcontroller 5 is provided by fine wires 4 which can be protected from damage. In accordance with some embodiments of the invention, the fluid or solid material that transfers the contact force to the transducer 2 can also serve to protect the wires 4 from damage. In accordance with some embodiments, a shield plate or other protective enclosure can be used to protect the wires 4 from damage during use. In accordance with other embodiments, the wires 4 and, optionally, the microcontroller 5 can be mounted on the opposite or back side of the substrate 1. In accordance with some embodiments, the wires 4 and microcontroller 5 can be enclosed in a housing or encapsulated in a protective material, such as epoxy or plastic.

Thus, as a person having ordinary skill would appreciate, the materials used in the tactile sensor 110 between contact surface 9 and the transducer 2 can be selected in accordance with the desired performance characteristics of the tactile sensor 110. This elastic material or combination of materials, also referred to as the force transmission medium, transfers the contact force or pressure distribution applied to the contact surface 9 of the tactile sensor 9 to the transducer 2.Thus, in some embodiments, the elasticity of the materials or combinations of materials can be selected, for example, to transmit some contact forces, while absorbing vibrations and/or noise as part of a dynamic system. In some embodiments of the invention, the force transfer medium can be a homogenous material and in other embodiments of the invention, the force transfer medium can constructed from layers of different materials or as a mixture of different materials in order to achieve the desired performance characteristics for the intended frequency and amplitude of the contact force to be detected.

In accordance with the various embodiments of the invention, the elastic material 8 that serves as all or part of the force transmission medium can be composed of most natural and synthetic rubber materials. The choice of material properties such as elastic modulus and hardness can vary with the application, but most any elastic material that can deform enough under pressure to transfer the desired contact force from the contact surface 9 to the transducer 2 can be used. Many of these elastic materials can be cast, starting as a liquid that can be poured or injected into place (with or without forms) and then allowed to cure. Some of these elastic materials can be usable in high temperature environments, such as those experienced in soldering and soldering rework. Some of the elastic materials can have minimal viscoelasticity to reduce the hysteresis in sensor readings. In accordance with some embodiments, the elastic material as well as the fluids (e.g., liquids or gases) used as part of the force transmission medium can be relatively incompressible. Liquids, such as oils can also be used. It is noted that foam and materials that include air bubbles can be used, however, these materials can be compressible and generally do not provide the same force transmission properties as incompressible materials and therefore may require additional structures or materials to provide the desired force transmission properties.

Figure 3:
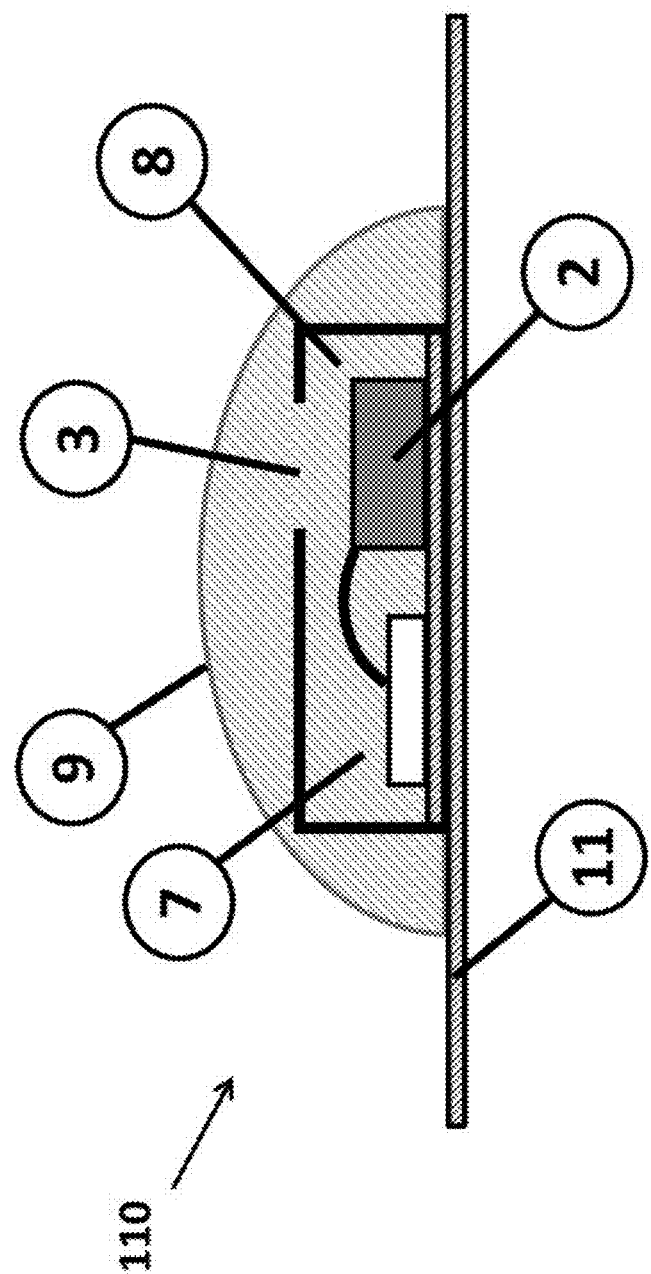
FIG. 3 shows an embodiment of a tactile sensor according to the present invention.

FIG. 3 shows an embodiment of a tactile sensor 110 according to the present invention. In this embodiment, the sensor 100 shown in FIG. 1 can be mounted, such as by soldering, to a printed circuit board 11 and then an elastic material 8 can be applied to encapsulate the sensor assembly in the force transmission medium. In accordance with some embodiments of the invention, the uncured elastic material 8 in flowable (e.g. liquid) form can be poured or injected onto the sensor in a vacuum, or under pressure, or the sensor assembly can be inserted into a vacuum or pressure chamber before the elastic material cures to remove any gas from the chamber 7. The resulting tactile sensor 110 includes a substantially uniform force transmission medium formed by the elastic material 8 that fills the chamber 7 and encloses the exterior of the sensor 100. The cured elastic material forms a contact surface 9 wherein contact forces or pressure distributions applied to the surface 9 are transmitted through opening 3 to the transducer 2. Sensor output can be converted to force measurements based on contact area or more sophisticated solid mechanics. In addition, calibration can be used to map sensor readings to applied forces.

In accordance with some embodiments, the contact surface 9 can be further treated or processed to provide it with a texture or features (projections or depressions) that can provide for additional sensing capabilities. The texture or features can be selected to enhance sensitivity of the tactile sensor 110 to specific objects.

Figure 4:
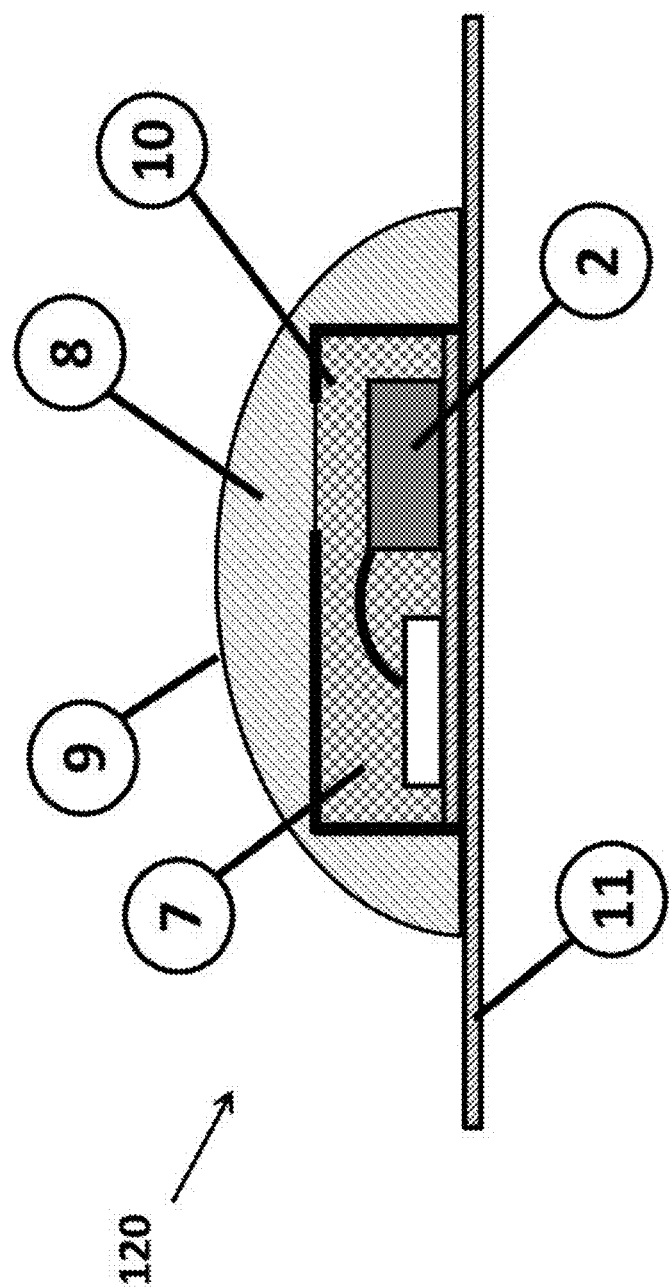
FIG. 4 shows an alternative embodiment of a tactile sensor according to the invention.

FIG. 4 shows an alternative embodiment of the tactile sensor 120 according to the invention. In this embodiment, the sensor 100 shown in FIG. 1 can be mounted, such as by soldering, to a printed circuit board 11 and the chamber 7 can be filled with a liquid or low viscosity elastic material. Then an elastic material 8 can be applied to encapsulate the sensor 100. In this embodiment, the force transmission medium is composed of the fluid/material in the chamber 7 and the elastic material 8 that encapsulates the sensor 100.

Figure 5:
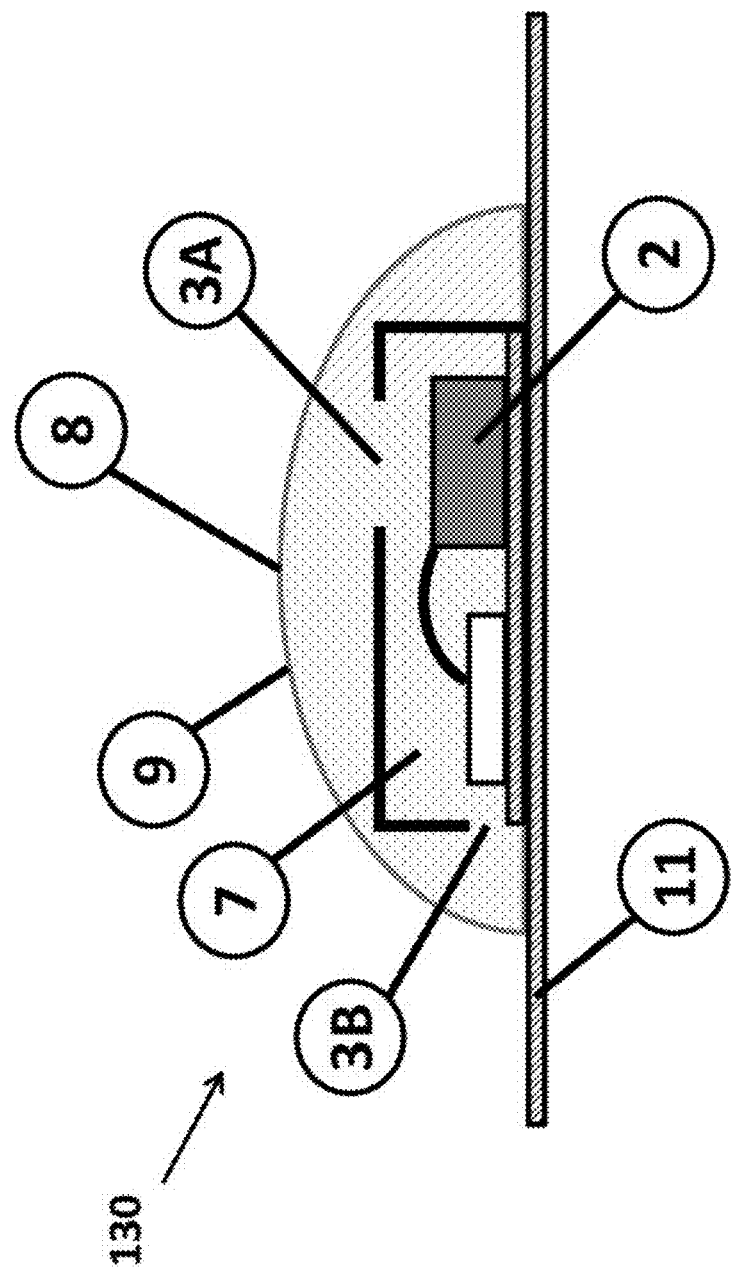
FIG. 5 shows an alternative embodiment of the tactile sensor according to the invention.

FIG. 5 shows an alternative embodiment of the tactile sensor 130 according to the invention. In this embodiment, the sensor 100 shown in FIG. 1 can be modified to include two openings 3A and 3B that enable the uncured elastic material 8 to flow into, for example, opening 3A while allowing air in the chamber 7 to escape through opening 3B. Alternatively, the uncured elastic material 8 can be injected through opening 3B, while air escapes through opening 3A. In this embodiment, the cured elastic material 8 functions as the force transmission medium. In accordance with some embodiments of the invention, additional openings can be provided.

FIGS. 6A and 6B show an alternative embodiment of the tactile sensor 140 according to the invention. In this embodiment, the sensor shown in FIG. 1 can be modified during fabrication to include an elastic material insert 18 that can be positioned inside the housing 6 prior to securing the housing 6 to the substrate 1. As shown in FIG. 6A, the elastic material insert 18 can include recesses 22, 25, 24 to accommodate the transducer 2, the microcontroller 5 and the wires 4. In accordance with some embodiments, the elastic material insert 18 can be formed by applying or injecting a liquid or soft elastic material that flows around or forms around the transducer, the microcontroller and the wires and, optionally, sets during or after the housing 6 is secured to the substrate 1. In accordance with some embodiments of the invention, the elastic material insert can include a portion that protrudes through opening 3 and provides a contact surface 9. In this embodiment, the elastic material insert 18 functions as the force transmission medium.

FIGS. 7A and 7B show an alternative embodiment of the tactile sensor 150 according to the invention. In this embodiment, a post 28 can be inserted through opening 3 and positioned in contact with the transducer 2. The post 28 can include a contact surface 9 over which a contact force or pressure distribution is applied and transmitted to the transducer 2. In this embodiment, the post 28 functions as the force transmission medium. The post 28 can be formed from a broad range of elastic materials including hard plastics and soft rubbers. The contact surface 9 can be expanded by affixing a sheet or a plate having a larger surface area to the portion of the post 28 that projects through opening 3. In accordance with some embodiments of the invention, the post 28 can be pre-tensioned by choosing its length to apply a resting load to the sensor to modify the range.

FIGS. 8A and 8B show an alternative method of making a tactile sensor 110 according to the invention. In this embodiment, the elastic material 8 can be injected under pressure directly into opening 3 of the sensor 100 shown in FIG. 1 and allowed to cure in a pressure chamber where pressure could be adjusted. The injection pressure can be negative (a vacuum), positive or atmospheric and the pressure in the pressure chamber can be negative (a vacuum), positive or atmospheric. Additionally, the pressures can be static or dynamic (e.g., changing from positive to negative or negative to positive over time). Optionally, addition volumes of elastic material can be applied over the outside of the sensor 100 forming a contact surface 9. In this embodiment, as shown in FIG. 8B, the elastic material 8 can function as the force transmission medium.

FIGS. 9A and 9B show alternative methods of making a tactile sensor 160 according to the present invention. In this embodiment, the sensor 100 shown in FIG. 1 can be modified by manufacturing it without the housing 6 (or by removing the housing 6) and applying an elastic material 8 over the transducer 2, the wires 4 and microcontroller 5. As shown in FIG. 9A, the elastic material 8 can be allowed flow over the sensor 100 forming a rounded or dome shaped configuration. As shown in FIG. 9B, a mold or forms can be positioned around the sensor 100 to support the elastic material 8 according to a predefined shape, such as a rectangular configuration. In accordance with some embodiments of the invention, the elastic material 8 can include a potting compound that provides mechanical protection for the wires 4 and sufficiently elastic to transmit the contact forces or pressure distributions applied to the contact surface 9 to the transducer 2. In accordance with some embodiments of the invention, a solid or mesh material shield 16 can be positioned over the wires 4 to protect them from damage, but allow the elastic material to flow in between and around the wires. The shield 16 would not extend over the transducer 2 and would not interfere with the transmission of contact forces to the transducer 2. In addition, the potting compound would also protect the wires and this embodiment provides a force-sensing module that can be soldered to a circuit board without further molding.

FIGS. 10A and 10B show different configurations of a tactile sensor 110 according to the invention and how the configurations can be used to control the functional properties of the device. FIG. 10A shows a tactile sensor 110 wherein the thickness of the elastic material over the sensor 100 is relatively small compared to that of FIG. 10B. FIG. 10*b* shows a tactile sensor 110 wherein the thickness of the elastic material over the sensor 100 is relatively large compared to that of FIG. 10A. As a result the sensitive contact area 9A of the contact surface 9 of the device shown in FIG. 10A can be smaller than the sensitive contact area 9*b* of the contact surface 9 of the device shown in FIG. 10B. However, in some embodiments, there can be a trade off in the sense that the sensitivity of the device shown in FIG. 10B may be lower than the device shown in FIG. 10A because the contact for may be distributed over a larger area. To increase the sensitivity, the stiffness of the elastic material 8 can be increased. Similarly, to decrease the sensitivity, the stiffness of the elastic material 8 can be decreased.

Figure 11A:
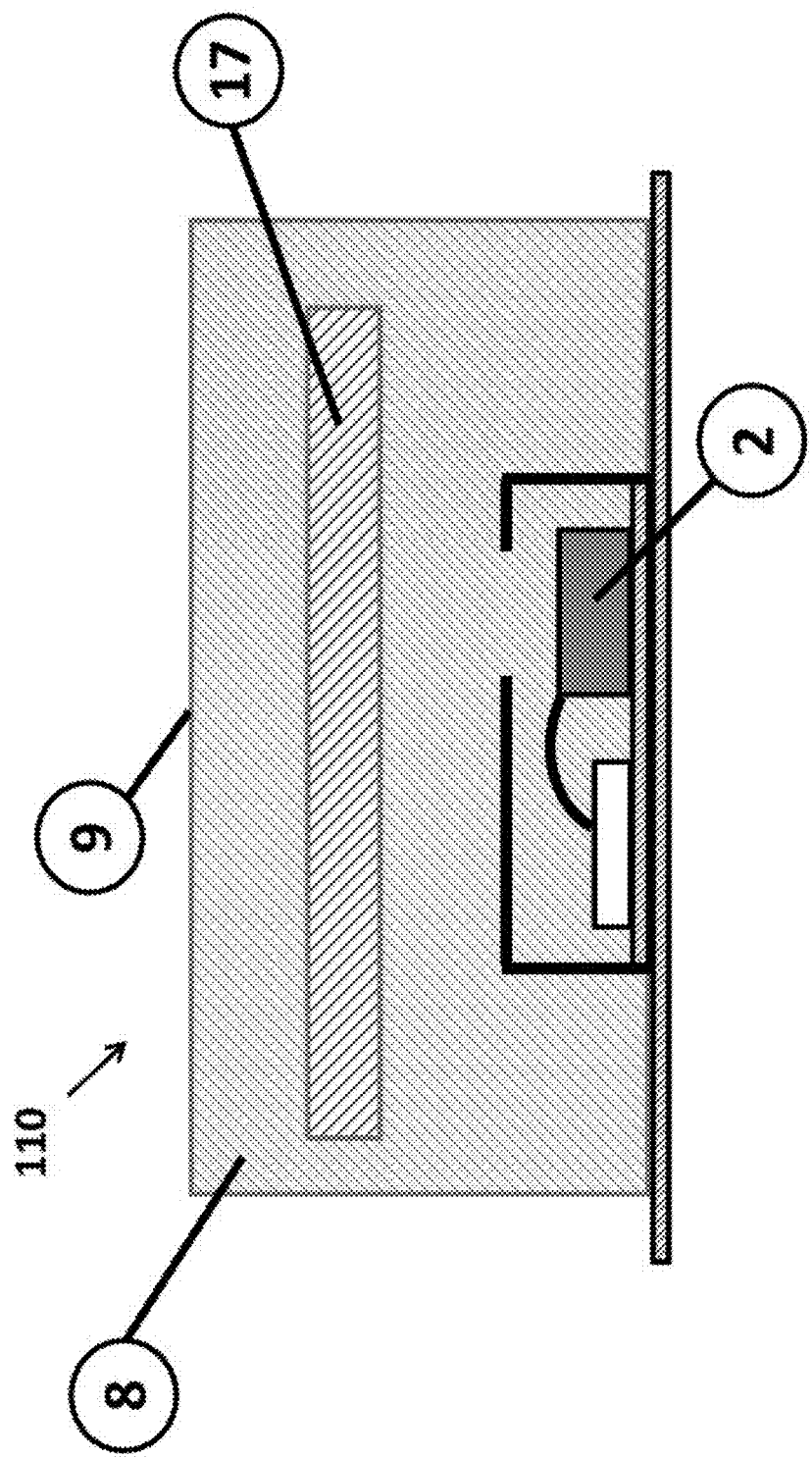
Figure 11B:
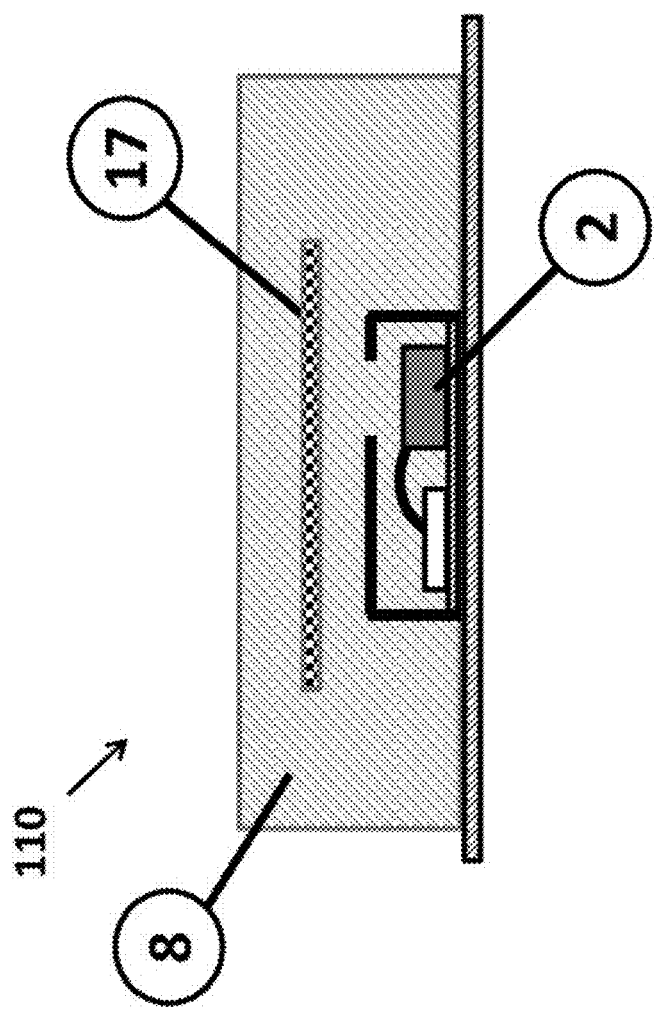

FIGS. 11A-11D show alternative embodiments of a tactile sensor 110 according to the present invention wherein the elastic material 8 includes additional elements 17 that modify the force transmission characteristics of the force transmission medium. FIG. 11A shows generally that a layer (e.g., a plate or sheet or fluid) can embedded in the elastic material 8 between the contact surface 9 and the transducer 2 to change how the contact for is experienced by the transducer 2. In the embodiment shown in FIG. 11B, a substantially rigid structure 17, such as a metal or hard plastic plate can be embedded in the elastic material 8, to change sensitivity of the device over the contact surface. For example, a rigid plate which is wider than the sensor placed on the elastic material 8 or within the elastic material 8 would dissipate the forces and as such, increase the sensitivity area. In other embodiments, a fluid channel filled with liquid or gas can be used to increase the sensitivity area or transfer the forces from one area of the sensor to another.

FIGS. 11C and 11D show an alternative embodiment of the tactile sensor 110 that can include a liquid or gas filled space between the contact surface 9 and the transducer 2 that can be used to change the sensitive are or range of the sensor 110. For example, a cavity 17 of liquid, such as oil, can be provided between the opening 3 in the sensor and the contact surface 9 as shown in FIG. 11C. Alternatively, the cavity 17 can be joined with the chamber 7 such that forces applied to any portion of the cavity 17 can be transmitted to chamber 7 and transducer 2.

Figure 12:
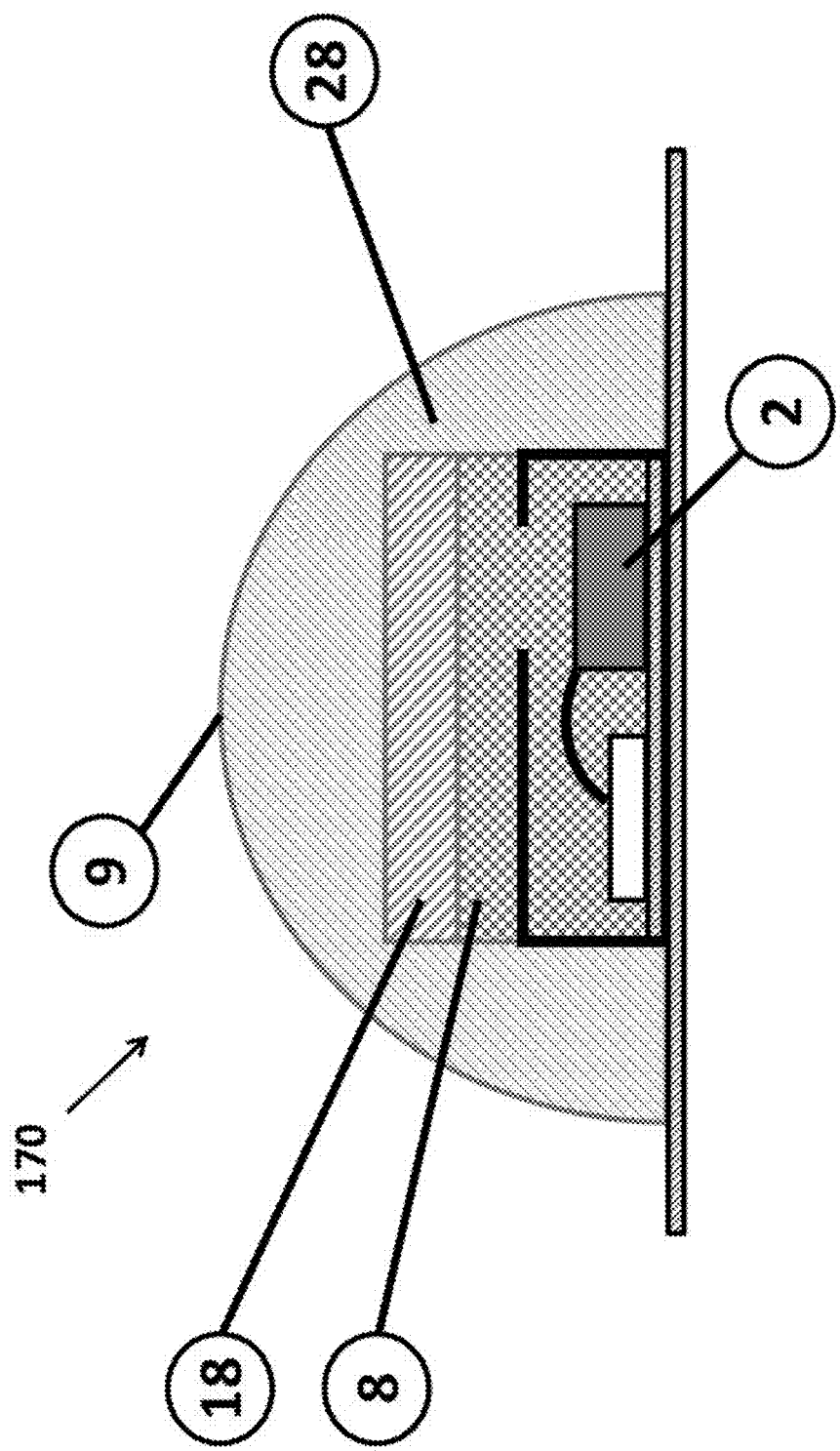
FIG. 12 shows an alternative embodiment of a tactile sensor according to the present invention.

FIG. 12 shows an alternative embodiment of a tactile sensor 170 according to the present invention. In this embodiment, embedded structures of different stiffness and/or compressibility can used to adjust the sensitivity range. For example, the sensor cavity 7 can be filed with a semi-soft material and then a layer of foam (softer material) can layers on top of the semi soft material and entire device can be enclosed in a relatively stiff or rigid material. The resulting device will be stiff, but sensitive to external forces.

In accordance with some embodiments of the invention, a number of sensors can be combined in order to expand the sensitivity range whereby each sensor is tuned to sense a defined range of forces. The tuning of each sensor can be performed using methods mentioned above (e.g. use filling materials with different stiffness)

Figure 13:
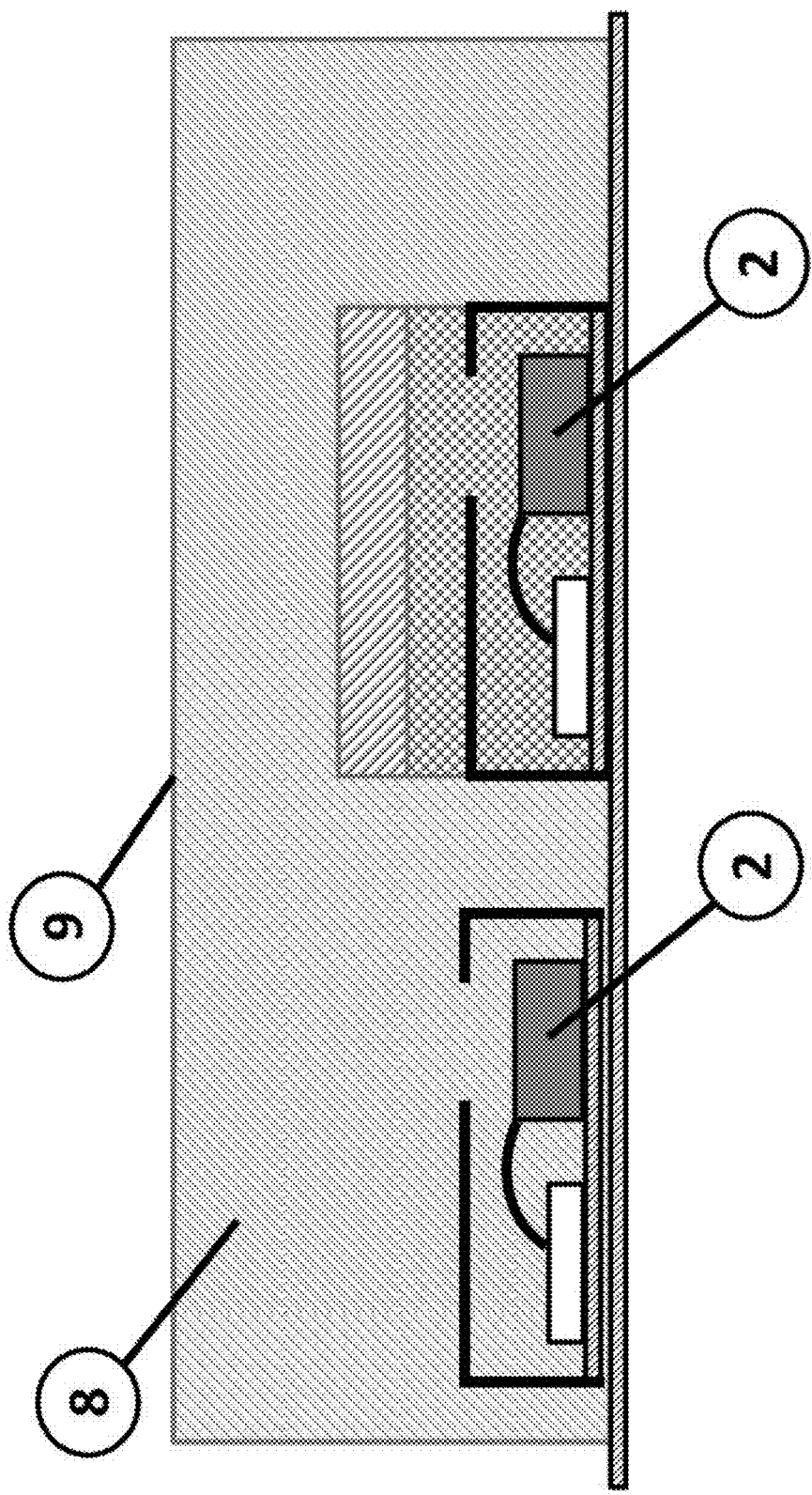
FIG. 13 shows an alternative embodiment of the invention that includes two or more sensors encapsulated in a force transmission medium.

FIG. 13 shows an alternative embodiment of the invention that includes two or more sensors encapsulated in a force transmission medium. In some embodiments, the force transmission medium between the contact surface 9 and transducer 2 can be the same, allowing for a larger sensitive area. In accordance with other embodiments of the invention, the force transmission medium between the contact surface 9 and the transducer 2 of two adjacent sensors can be different providing a broader range of sensing capabilities in the same sensing area. For example, a first sensor could be sensitive to one range of forces and the second sensor could be configured to sense forces above (or below) the range of the first sensor.

Figure 14:
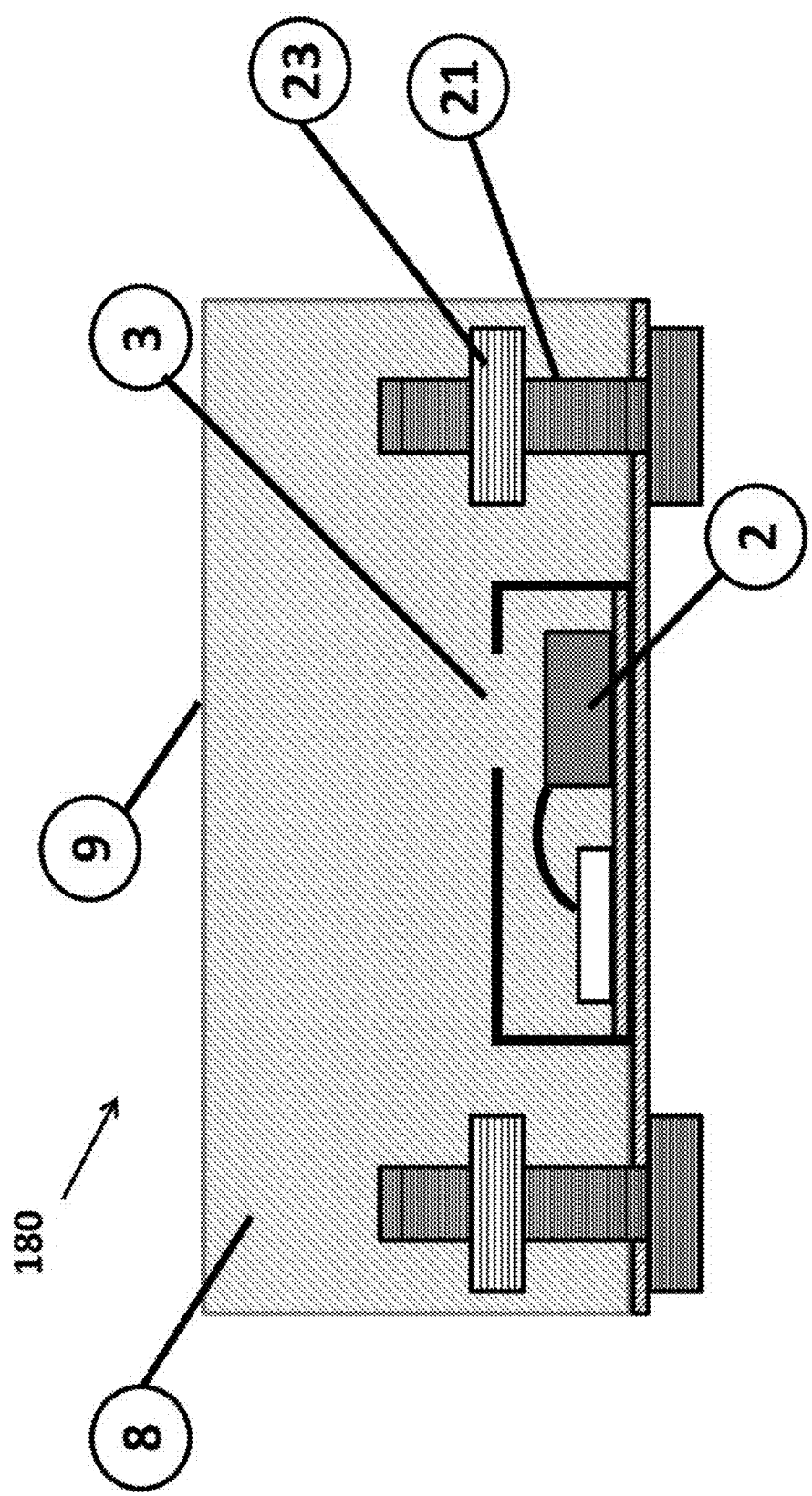
FIG. 14 shows an alternative embodiment of a tactile sensor according to the present invention.

FIG. 14 shows an alternative embodiment of a tactile sensor 180 according to the present invention. The transducer 2 is configured within the sensor 200 to provide a predefined sensing range. In accordance with the invention, the device can be configured to expand one of the ranges (e.g., the positive or negative range) by shifting the mean values (i.e. no-load offset) by combining materials which will pre-stress or pre-strain the transducer of the sensor. In this embodiment, the range of tactile forces can be adjusted by pre-stressing the elastic material 8. As shown in FIG. 14, the elastic material 8 can include embedded nuts 23 (or other threaded elements) and screws or bolts 21 that extend through the circuit board 11 and the elastic material 8 to engage the embedded nuts 23. As the screws 21 are tighten, the elastic material 8 is compressed and pressure is applied to pre-stress the transducer 2, making the device more sensitive to in the lower range of contact forces than without the screws. Alternatively, springs can be embedded in in the elastic material 8 to resist the transmission of the contact forces to the transducer 2 and make the device more sensitive to larger contact forces or pressure distributions.

Applications

Figure 15:
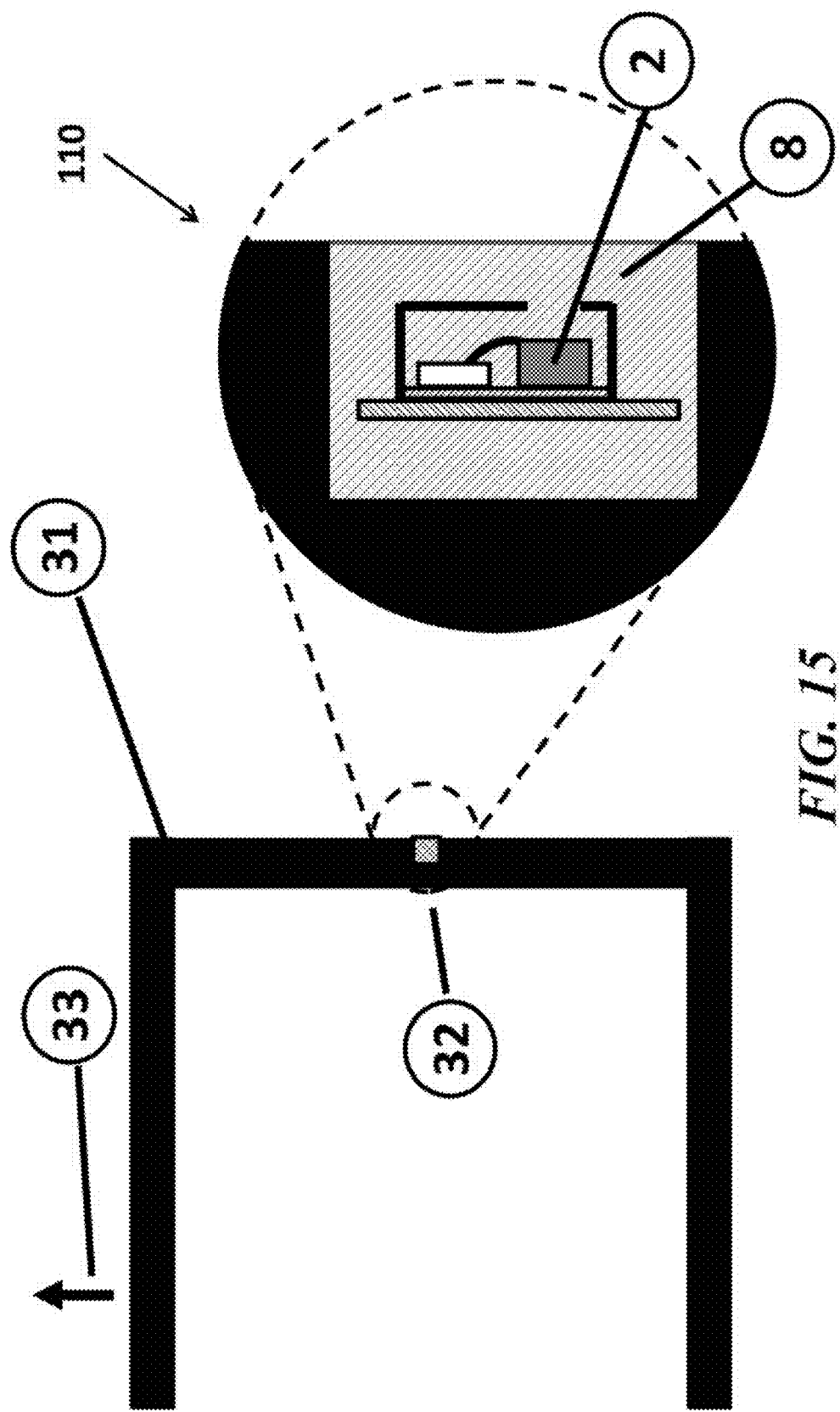
FIG. 15 shows an example of one application for use of the tactile sensors according to embodiments of the invention.

FIG. 15 shows an example of one application for use of the tactile sensors described above. In this application the sensor 110 can be used to sense forces applied to a rigid structure 31 by embedding the sensor 110 into the frame. In accordance with some embodiments, a pocket 32 can be formed in the frame at one or more strategic structural locations and the sensor 110 can be cast into the pocket using the elastic material. The sensors 110 can replace strain gauges. In operation, the forces applied to the rigid structure 31 will cause stress and strain in the area of the sensor 110 that can be transmitted by the elastic material acting as a force transmission medium to the transducer 2. The output of the sensor 110 will be a function of the forces acting the structural member 31.

Figure 16:
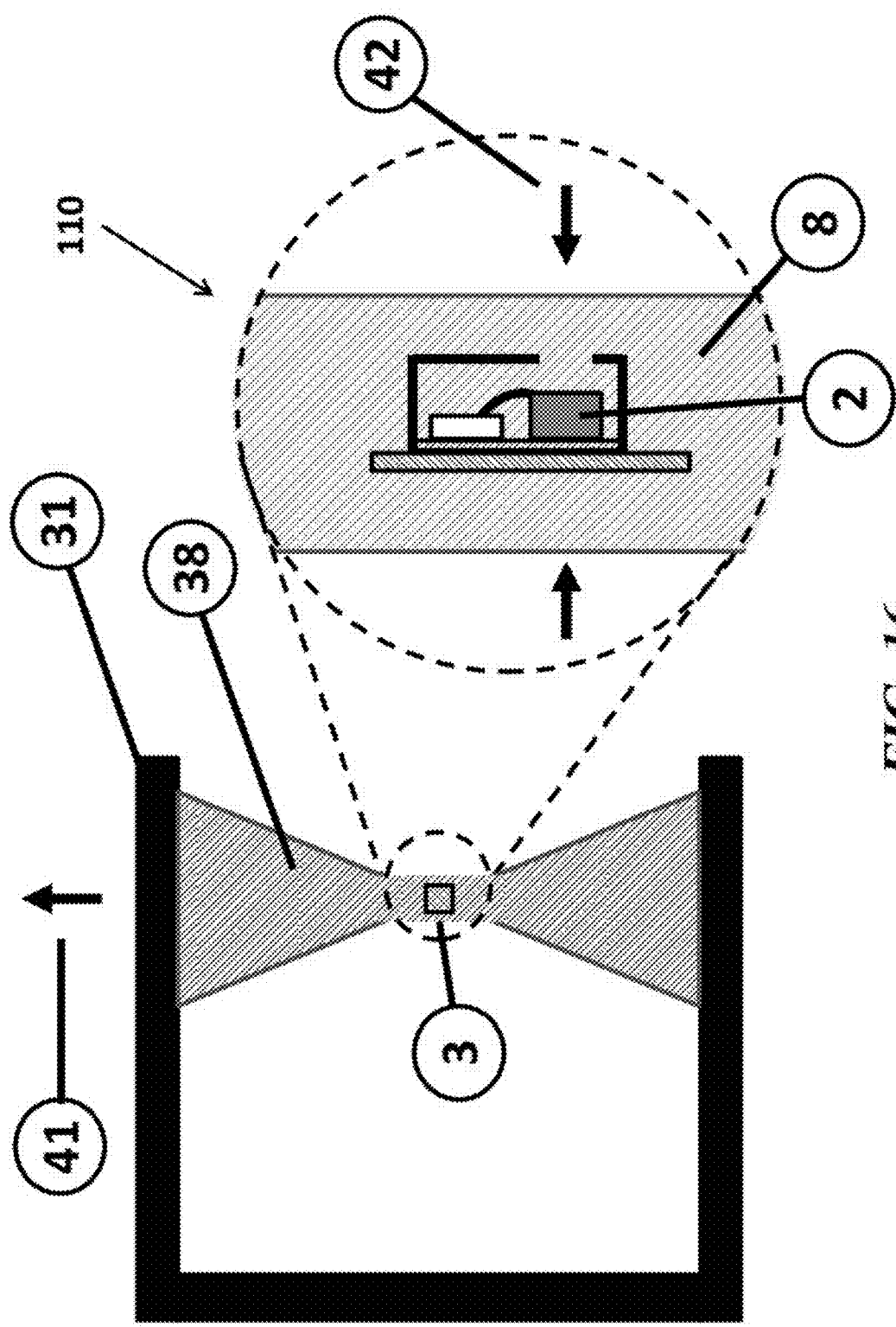
FIG. 16 shows an example of another application for use of the tactile sensor according to embodiments of the invention.

FIG. 16 shows an example of another application for use of the tactile sensor described above. In this application the tactile sensor 110 can be used to sense forces 41 applied to a rigid structure 31 by embedding the tactile sensor 110 into a soft and elastic structure 38 that extends between two sections of the frame 31. In accordance with some embodiments, a flexible structure 38, such as a rubber post or plate, can be fabricated by embedding the sensor 110 in a post or plate constructed from an elastic material 8. In operation, the forces 41 applied to the rigid structure 31 will cause the rigid structure 31 to deform and the rubber post or plate will shorten or elongate and causing the flexible structure 38 to deform 42. The deformation forces 42 applied to the rubber post or plate 38 can be transmitted by the elastic material acting as a force transmission medium to the transducer 2. The output of the sensor 110 will be a function of the forces acting the structural member 31.

Figure 17:
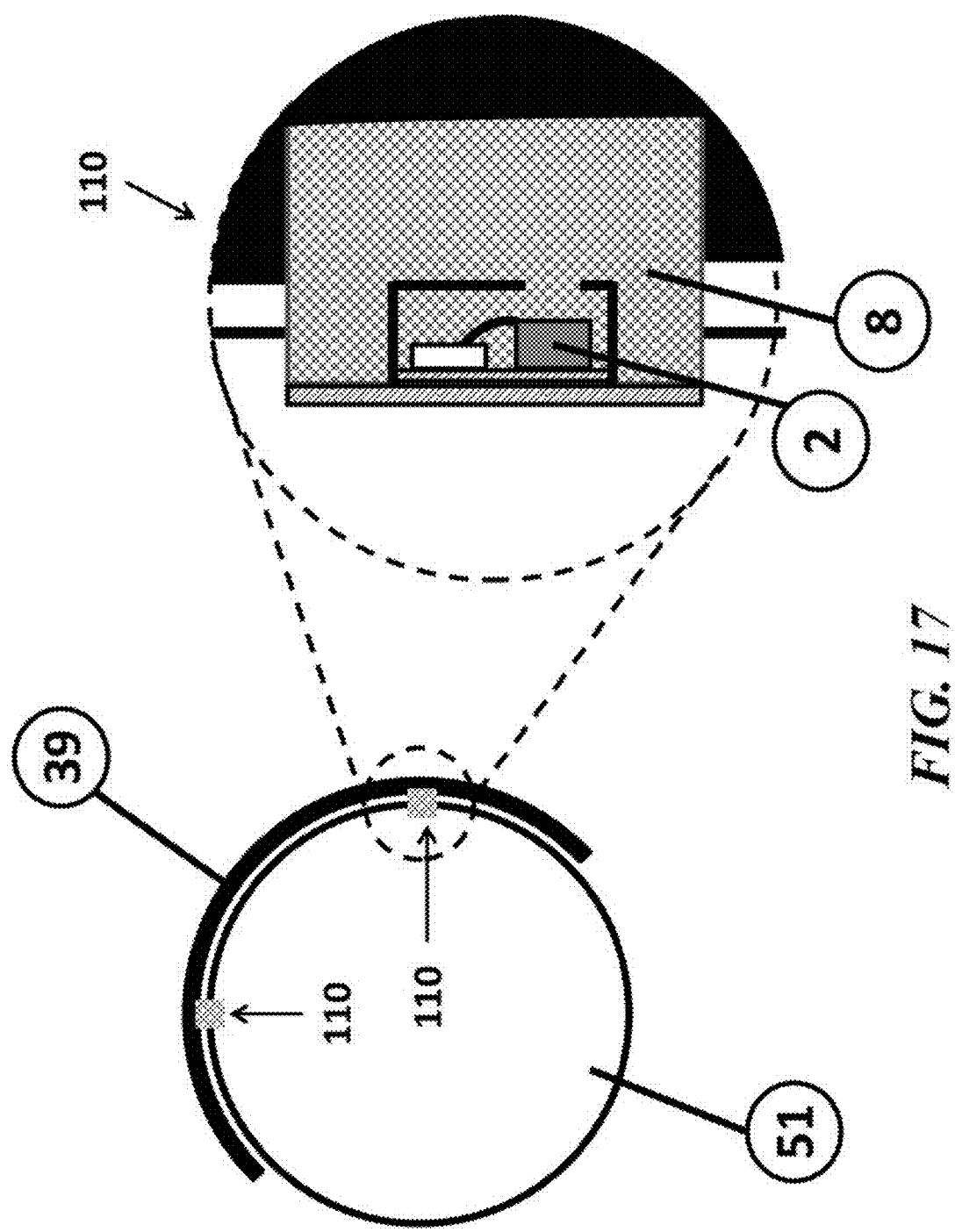
FIG. 17 shows an example of another application for use of the tactile sensor according to embodiments of the invention.

FIG. 17 shows an example of another application for use of the tactile sensor 110 described above. In this application, a contact bumper 39 is supported by one or more tactile sensors 110, such that forces resulting from contact with the bumper 39 can be indicated by one or more transducers 2. In accordance with some embodiments of the invention, as shown in FIG. 17, two or more tactile sensors 110 can be arranged at 90 degrees (or any predefined angular configuration) around a circular or rectangular object 51 (e.g., either mobile or stationary) and a bumper 39 can be affixed to the contact surface 9 of each sensor 110, such that contact forces applied to the bumper 39 are transferred to the contact surface 9 and through the elastic material 8 to the transducer 2. When contact is made along the bumper 39, each of the tactile sensors 110 will indicate a contact and a force and the known positional relationship between the sensors can be used to estimate the location and magnitude of the contact on the object 51.

Figure 18:
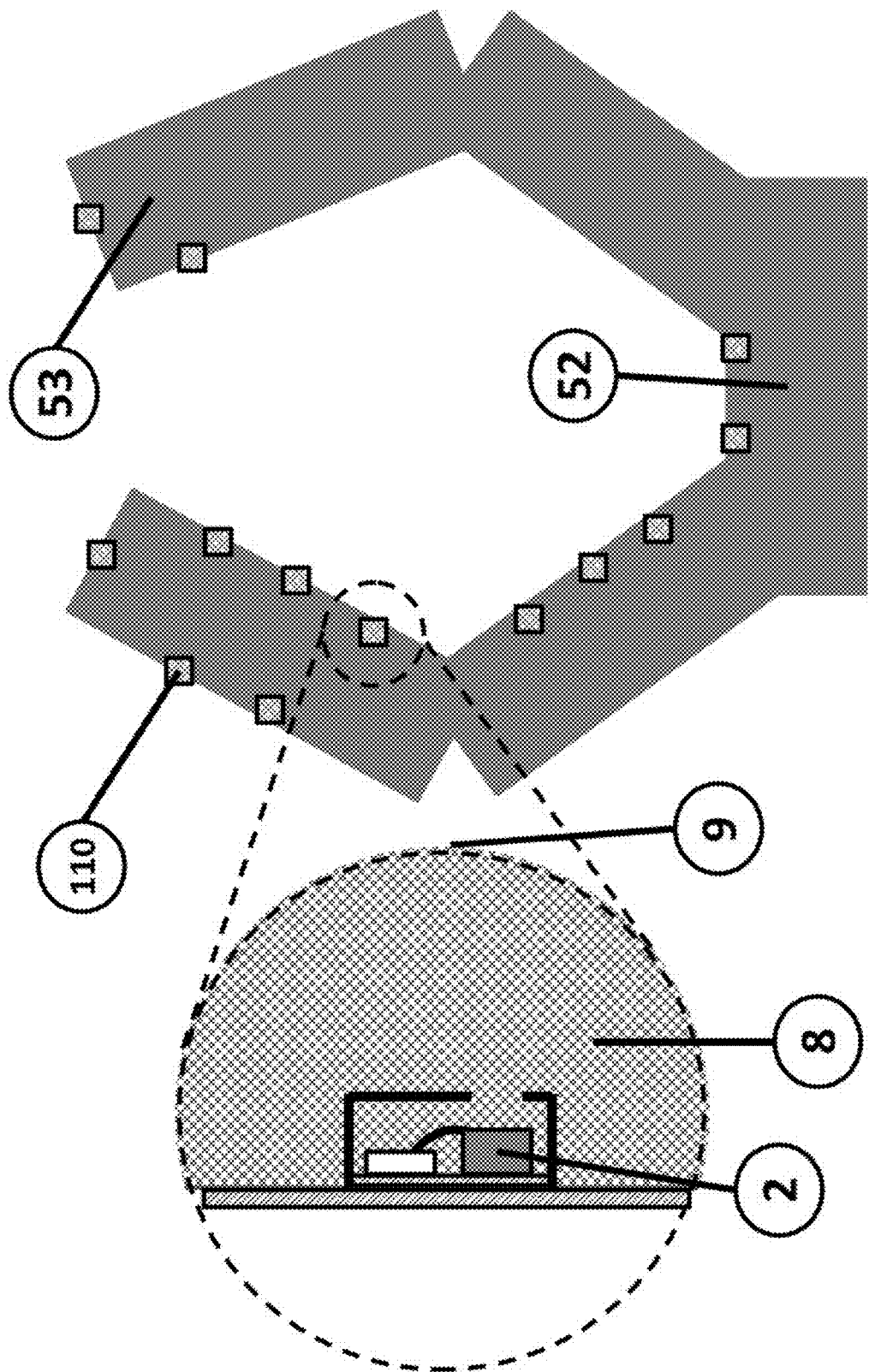
FIG. 18 shows an application of the tactile sensors according some embodiments of the invention.

FIG. 18 shows an application of the tactile sensors according some embodiments of the invention. In this embodiment, the tactile sensors 110 can be affixed to predefined locations on a robotic end effector, such as a gripper 52 wherein each of the jaws or fingers 53 includes one or more tactile sensors 110 wired into a control system that can be used to detect the location and the force level of the contact. The sensors 110 can be applied in array configurations to provide for extensive coverage or the sensors 110 can be applied at strategic locations only. The tactile sensors 110 can be used to detect the gripping/grasping force to allow the gripper 52 to hold delicate as well as tough items. The tactile sensors 110 can also be used to detect obstacles around the gripped item and/or measure object properties. The tactile sensors 110 can also detect whether the gripped item is slipping based on vibrations (sensed by sampling at a high frequency), or shifts in the pressure distribution across multiple sensors.

Figure 19:
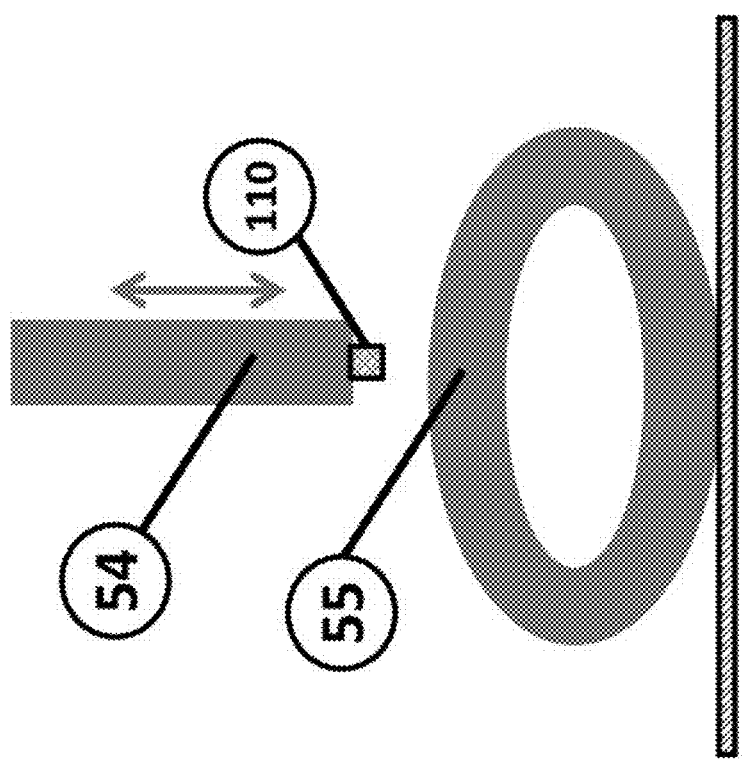
FIG. 19 shows an application of the tactile sensors according some embodiments of the invention.

FIG. 19 shows an application of the tactile sensors according some embodiments of the invention. In this embodiment, the tactile sensors 110 can be affixed to predefined locations on a moving element 54 of a machine, for example, such as that used in industrial automation applications. The moving element 54 and sensor 110 can be used to test product 55 stiffness (e.g., freshness, curing, etc.), the presence of an object, a measure of contact or grasp force or grasp quality and to measure object to object forces during assembly.

Figure 20:
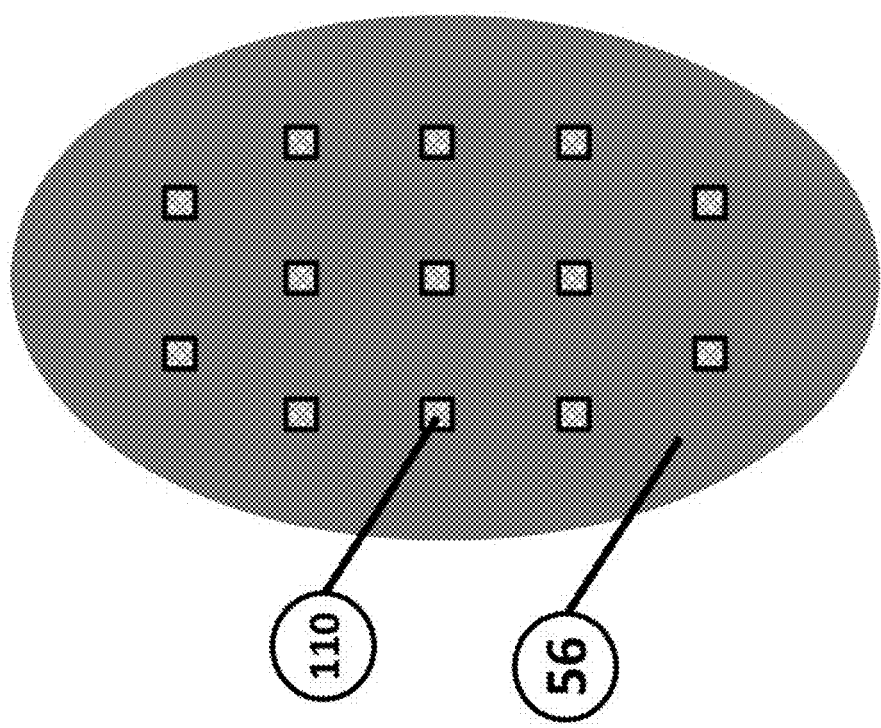
FIG. 20 shows an application of the tactile sensors according some embodiments of the invention.

FIG. 20 shows an application of the tactile sensors according some embodiments of the invention. In this embodiment, the tactile sensors 110 can be affixed to predefined locations on a pressure plate 56, such as the sole of a foot or the palm of a hand to measure contact and support forces. Arrays of sensors 110 can be used to measure ground texture, determine center-of-pressure and pressure distribution of the pressure plate 56. This data can be used for balance and leveling applications.

Figure 21:
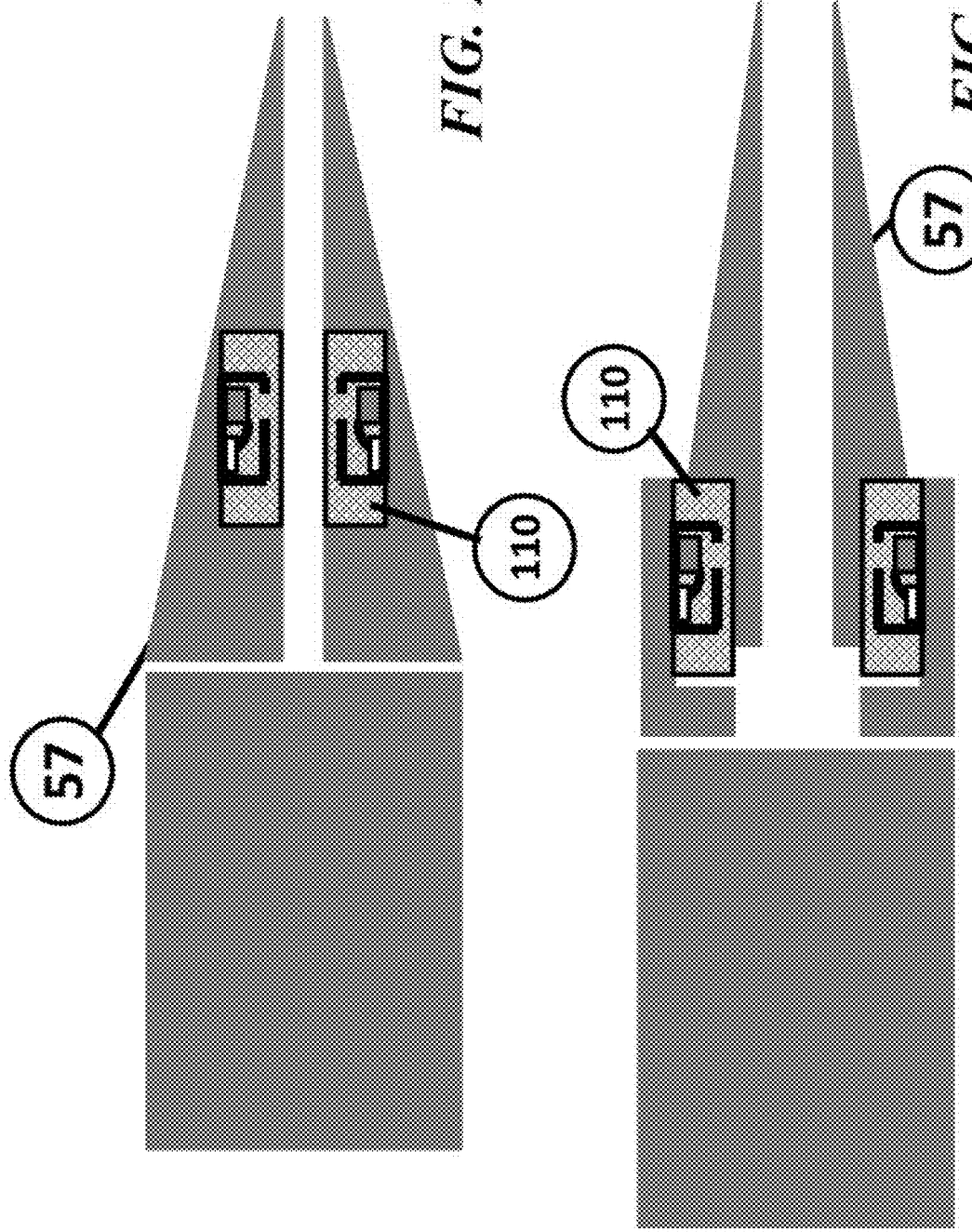
FIGS. 21A and 21B show an application of the tactile sensors according some embodiments of the invention.

FIGS. 21A and 21B show an application of the tactile sensors according some embodiments of the invention. In this embodiment, the tactile sensors 110 can be affixed to predefined locations on a surgical or small robotic gripper wherein each of the jaws or fingers 57 includes one or more tactile sensors 110 wired into a control system that can be used to detect the force level of the gripper. As shown in FIG. 21A, the sensors 110 can be placed in the location of contact for the gripper jaws or fingers 57 to register the gripping force. As shown in FIG. 21B, the jaws or fingers 57 can be mounted to the sensors 110 which are mounted on the actuator elements that move the jaws 57 and can sense the forces that resist the motion of the jaws 57.

Figure 22:
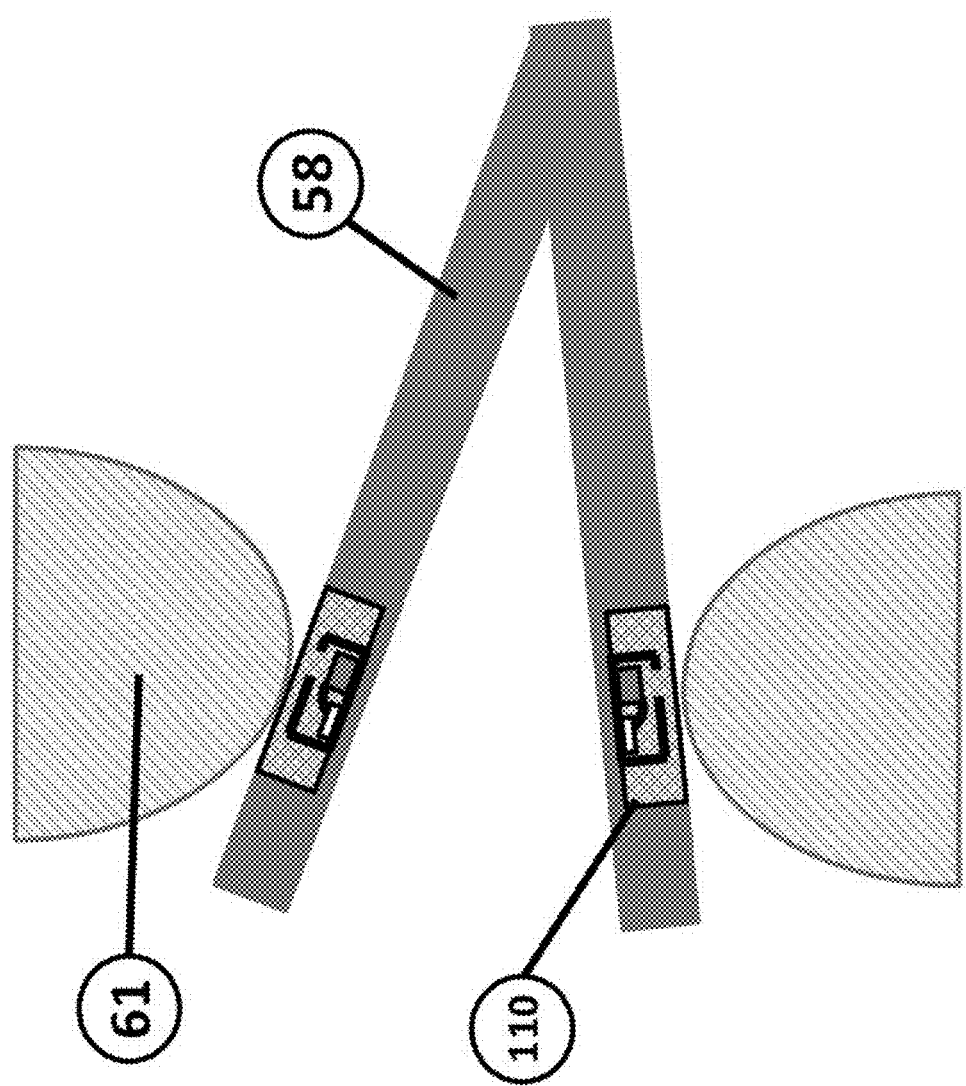
FIG. 22 shows an application of the tactile sensors according some embodiments of the invention.

FIG. 22 shows an application of the tactile sensors according some embodiments of the invention. In this embodiment, the tactile sensors 110 can be affixed to predefined locations on a tool handle or control element 58 (e.g., joystick or steering wheel) to provide haptic control of a tool, for example, for control of a surgical tool or other mechanical interface for computer games or vehicular control. In accordance with this embodiment, the handle or control element 58 can include one or more tactile sensor 110 embedded or affixed to the outer surface to detect the contact forces or pressure distributions applied by the user's hand or finger 61 to provide enhances control. The detected force applied by the user's fingers 61 can be used to control the force applied by the controlled tool or device.

Figure 23:
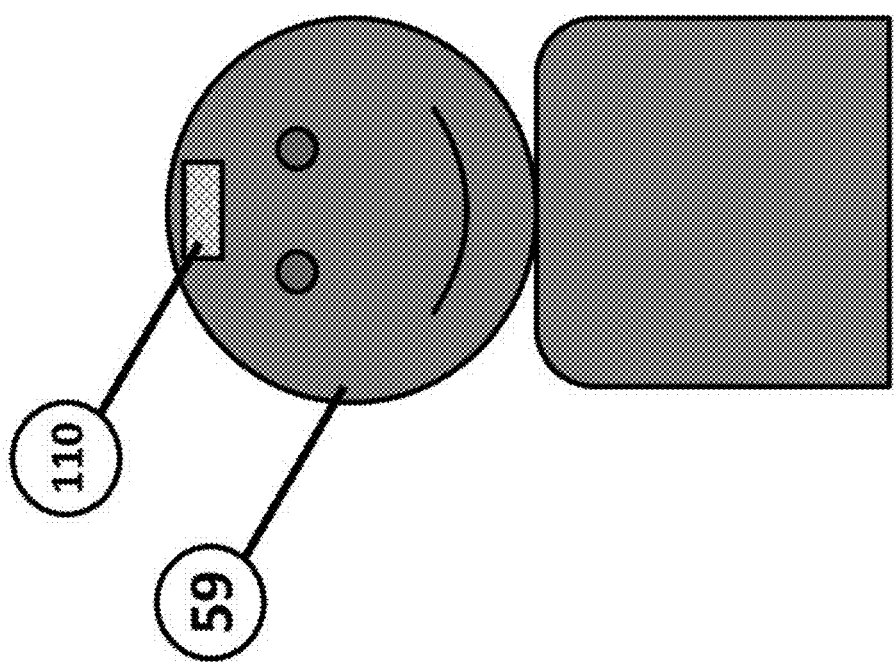
FIG. 23 shows an application of the tactile sensors according some embodiments of the invention.

FIG. 23 shows an application of the tactile sensors according some embodiments of the invention. In this embodiment, the tactile sensors 110 can be affixed to predefined locations on a toy or simulation device such as a doll 59 to register interaction with a child playing with toy 59 and provide audio or visual response to the contact.

Figure 24:
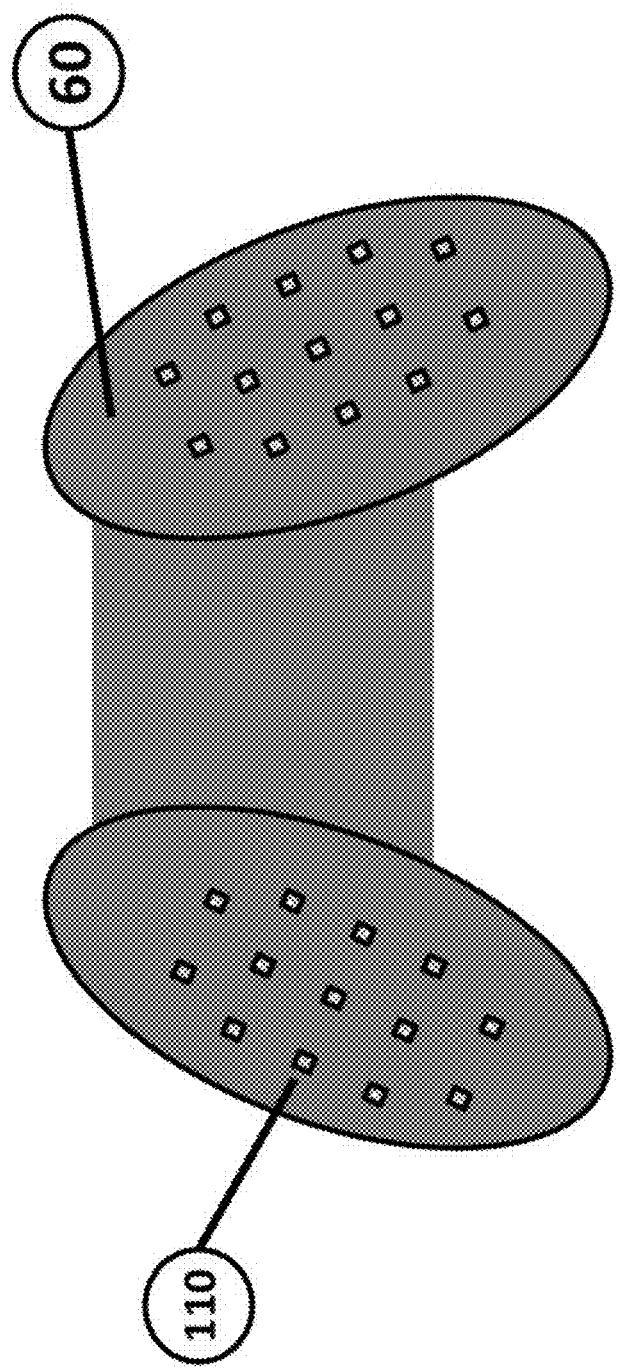
FIG. 24 shows an application of the tactile sensors according some embodiments of the invention.

FIG. 24 shows an application of the tactile sensors according some embodiments of the invention. In this embodiment, the tactile sensors 110 can be affixed to predefined locations on a video game controller 60 which can be used to control actions in a video game. The tactile sensors 110 can be provided in an array and provide a measure of the grip force, the grip distribution and the location of contact. A removable, flexible overlay can be provided which allows the surface of the controller to be reconfigured for different video games.

In accordance with the invention, the tactile sensors 110 can be connected to a dedicated controller that receives the signals from one or more sensors 110 can changes the operation of the controller. Similarly, the one or more sensors 110 can be connected to a programmable computer, which under software control can change the operation of the programmable computer, cause a machine to operate, cease operating or change its operation.

Embodiments of various aspects of the invention described herein can be defined by any of the following numbered paragraphs:

1. A contact pressure sensor comprising
   a transducer mounted to a substrate;
   a housing enclosing the transducer and forming a chamber between the housing and the transducer, the housing having at least one opening, connecting the chamber and the transducer to an area outside the housing; and
   a force transmission medium in mechanical communication with a contact surface and providing a path to transmit a contact force or pressure distribution applied to the contact surface to the transducer.
2. The contact pressure sensor according to paragraph 1 wherein the force transmission medium includes a substantially incompressible elastic material.
3. The contact pressure sensor according to paragraph 1 wherein the force transmission medium includes an elastomer, such as foam rubber.
4. The contact pressure sensor according to paragraph 1 wherein the force transmission medium includes at least two different elastic materials 5. The contact pressure sensor according to paragraph 1 wherein the force transmission medium includes at least one substantially incompressible material and at least one compressible material.
6. The contact pressure sensor according to paragraph 1 wherein the force transmission medium includes a liquid.
7. The contact pressure sensor according to paragraph 1 wherein the force transmission medium includes a gas.
8. The contact pressure sensor according to paragraph 1 wherein the force transmission medium forms the contact surface.
9. The contact pressure sensor according to paragraph 1 wherein the transducer includes at least one of a MEMS device such as a diaphragm, cantilever, or moving island, instrumented with one or more sensors to measure displacement or pressure such as a piezoresistive sensor (e.g., using a wheatstone bridge configuration), a capacitive sensor (e.g., using a comb or parallel-plate configuration), a mechanical oscillator, or an optical sensor, a capacitive displacement sensor having a movable plate, or an optical displacement sensor.
10. The contact sensor according to paragraph 1 wherein the transducer includes a MEMS pressure transducer, the transmission medium includes an elastomer, the housing includes a metal case, and the contact surface is formed by the transmission medium.
11. A method of making a contact pressure sensor, the contact pressure sensor including:
   a transducer mounted to a substrate and a housing enclosing the transducer; the housing forming a chamber between the housing and the transducer, the housing having at least one opening, connecting the chamber and the transducer to an area outside the housing
   the method comprising:
   introducing a transmission medium into the housing chamber; wherein the transmission medium forms a path for the transmission of forces applied to the contact surface to the transducer
12. The method according to paragraph 11 wherein introducing the transmission medium includes applying an elastic liquid material over the housing; and subjecting the liquid material and the housing to a vacuum whereby the liquid material flows into the chamber and forms a force transmission path between a contact surface and the transducer.
13. The method according to paragraph 11 wherein introducing the transmission medium includes injecting a liquid material into the chamber.
14. The method according to paragraph 11 wherein introducing the transmission medium includes pouring a low-viscosity liquid or liquid elastic material over the housing and chamber wherein the liquid flows into the chamber.
15. The method according to paragraph 11 wherein introducing the transmission medium includes filling the chamber through one opening and allowing the air to escape from a different opening.
16. The method according to paragraph 11 wherein introducing the transmission medium includes applying a surfactant to the housing whereby a liquid material flows into the chamber and forms a contact surface over at least a portion of the substrate.
17. The method according to paragraph 11 wherein introducing the transmission medium includes inserting a rigid or elastic object as a portion of the transmission medium.
18. The method according to any of paragraphs 11 to 17 wherein the liquid transmission medium solidifies into an elastomer.
19. The method according to any of paragraphs 11 to 18 wherein the transmission medium is configurable to selectively apply a pressure on the transducer to pre-stress the transducer and change the sensitivity of the contact pressure sensor.
20. The method according to any of paragraphs 11 to 18 wherein the transmission medium is configured to apply a predefined pressure on the transducer to pre-stress the transducer and change the sensitivity of the contact pressure sensor.
21. The method according to any of paragraphs 11 to 20 wherein introducing the transmission medium includes introducing a second material that forms an element in the path between the contact surface and the transducer.
22. The method according to any of paragraphs 11 to 21 further comprising modifying at least one physical property of the housing in order to change the force transmission properties between the contact surface and the transducer.
23. The method according to any of paragraphs 11 to 22 further comprising modifying at least one of a size and a location of the opening in the housing.
24. A method of making a contact sensor from a pressure sensor, the pressure sensor including:
   a transducer mounted to a substrate and a housing enclosing the transducer; the
   housing forming a chamber between the housing and the transducer;
   the method comprising:
   removing the housing from the pressure sensor; and
   applying a transmission medium in contact with the transducer, the transmission medium serving to communicate forces from a contact surface to the transducer.
25. The method according to paragraph 23 wherein the removal of the housing occurs after affixing the transducer package to the substrate.

Other embodiments are within the scope and spirit of the invention. For example, due to the nature of software, functions described above can be implemented using software, hardware, firmware, hardwiring, or combinations of any of these. Features implementing functions can also be physically located at various positions, including being distributed such that portions of functions are implemented at different physical locations.

Further, while the description above refers to the invention, the description may include more than one invention.

What is claimed is:
1. A method of making a contact pressure sensor, the contact pressure sensor including:
   a transducer mounted to a substrate and a housing enclosing the transducer;
   the housing forming a chamber between the housing and the transducer, the housing having at least one opening, connecting the chamber and the transducer to an area outside the housing
   the method comprising:
   introducing a transmission medium into the housing chamber; wherein the transmission medium forms a path for the transmission of forces applied to the contact surface to the transducer,
  wherein introducing the transmission medium includes applying a surfactant to the housing whereby a liquid material flows into the chamber and forms a contact surface over at least a portion of the substrate.

2. The method according to claim 1 wherein introducing the transmission medium includes injecting a liquid material into the chamber.

3. The method according to claim 1 wherein introducing the transmission medium includes pouring a low-viscosity liquid or liquid elastic material over the housing and chamber wherein the liquid flows into the chamber.

4. The method according to claim 1 wherein introducing the transmission medium includes filling the chamber through one opening and allowing the air to escape from a different opening.

5. The method according to claim 1 wherein introducing the transmission medium includes inserting a rigid or elastic object as a portion of the transmission medium.

6. The method according to claim 1 wherein the transmission medium is introduced as a liquid medium that solidifies into an elastomer.

7. The method according to claim 1 wherein introducing the transmission medium includes introducing a second material that forms an element in the path between the contact surface and the transducer.

8. The method according to claim 1 further comprising modifying at least one physical property of the housing in order to change a force transmission property of the transmission medium between the contact surface and the transducer.

9. The method according to claim 1 further comprising modifying at least one of a size and a location of the opening in the housing.

10. A method of making a contact pressure sensor, the contact pressure sensor including:
  a transducer mounted to a substrate and a housing enclosing the transducer;
  the housing forming a chamber between the housing and the transducer, the housing having at least one opening, connecting the chamber and the transducer to an area outside the housing
  the method comprising:
  introducing a transmission medium into the housing chamber; wherein the transmission medium forms a path for the transmission of forces applied to the contact surface to the transducer,
  wherein introducing the transmission medium includes applying an elastic liquid material over the housing; and subjecting the liquid material and the housing to a vacuum whereby the elastic liquid material flows into the chamber and forms a force transmission path between a contact surface and the transducer.

11. The method according to claim 10 wherein introducing the transmission medium includes injecting a liquid material into the chamber.

12. The method according to claim 10 wherein introducing the transmission medium includes pouring a low-viscosity liquid or liquid elastic material over the housing and chamber wherein the liquid flows into the chamber.

13. The method according to claim 10 wherein introducing the transmission medium includes filling the chamber through one opening and allowing the air to escape from a different opening.

14. The method according to claim 10 wherein introducing the transmission medium includes applying a surfactant to the housing whereby a liquid material flows into the chamber and forms a contact surface over at least a portion of the substrate.

15. The method according to claim 10 wherein introducing the transmission medium includes inserting a rigid or elastic object as a portion of the transmission medium.

16. The method according to claim 10 wherein the transmission medium is introduced as a liquid medium that solidifies into an elastomer.

17. The method according to claim 10 wherein introducing the transmission medium includes introducing a second material that forms an element in the path between the contact surface and the transducer.

18. The method according to claim 10 further comprising modifying at least one physical property of the housing in order to change a force transmission property of the transmission medium between the contact surface and the transducer.

19. The method according to claim 10 further comprising modifying at least one of a size and a location of the opening in the housing.

* * * * *